(12) United States Patent
Zhang et al.

(10) Patent No.: US 10,908,235 B2
(45) Date of Patent: Feb. 2, 2021

(54) METHOD OF FAST IMAGING OF NMR PARAMETERS WITH VARIABLY-ACCELERATED SENSITIVITY ENCODING

(71) Applicant: The Johns Hopkins University, Baltimore, MD (US)

(72) Inventors: Yi Zhang, Baltimore, MD (US); Jinyuan Zhou, Cockeysville, MD (US); Paul A. Bottomley, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 108 days.

(21) Appl. No.: 16/091,785

(22) PCT Filed: Apr. 7, 2017

(86) PCT No.: PCT/US2017/026706
§ 371 (c)(1),
(2) Date: Oct. 5, 2018

(87) PCT Pub. No.: WO2017/177197
PCT Pub. Date: Oct. 12, 2017

(65) Prior Publication Data
US 2019/0101603 A1    Apr. 4, 2019

Related U.S. Application Data

(60) Provisional application No. 62/320,197, filed on Apr. 8, 2016.

(51) Int. Cl.
*G01R 33/24*    (2006.01)
*G01R 33/561*   (2006.01)
(Continued)

(52) U.S. Cl.
CPC ....... *G01R 33/246* (2013.01); *G01R 33/4806* (2013.01); *G01R 33/50* (2013.01);
(Continued)

(58) Field of Classification Search
CPC .............. G01R 33/246; G01R 33/5611; G01R 33/4806; G01R 33/50; G01R 33/5605; G01R 33/56341; G01R 33/56366
(Continued)

(56) References Cited

U.S. PATENT DOCUMENTS 7,941,204 B1 *   5/2011   Wang ................. G01R 33/4824
                                                              600/420
9,170,315 B2 *  10/2015   Choi ................. G01R 33/34092
(Continued)

FOREIGN PATENT DOCUMENTS

| WO | 2003042711 A1 | 5/2003 |
| WO | 2003052440 A2 | 6/2003 |
| WO | 2014195384 A1 | 12/2014 |

OTHER PUBLICATIONS

International Search Report issued in PCT International Application No. PCT/US2017/026706 dated Jun. 20, 2017.
(Continued)

*Primary Examiner* — Christopher P Mcandrew
(74) *Attorney, Agent, or Firm* — Venable LLP; Henry J. Daley

(57) ABSTRACT

A method of spatially imaging a nuclear magnetic resonance (NMR)parameter whose measurement requires the acquisition of spatially localized NMR signals in a sample includes placing the sample in an MRI apparatus with a plurality of MRI detectors each having a spatial sensitivity map; and applying MRI sequences adjusted to be sensitive to the NMR parameter. At least one of the MRI sequences is adjusted so as to substantially fully sample an image k-space
(Continued)

of the sample. The remainder of the MRI sequences is adjusted to under-sample the image k-space. The method further includes acquiring image k-space NMR signal datasets; estimating a sensitivity map of each of the MRI detectors using a strategy to suppress unfolding artefacts; and applying the estimated sensitivity maps to at least one of the image k-space NMR signal data sets to reconstruct a spatial image of NMR signals that are sensitive to the NMR parameter.

19 Claims, 15 Drawing Sheets

(51) Int. Cl.
    *G01R 33/48*      (2006.01)
    *G01R 33/50*      (2006.01)
    *G01R 33/56*      (2006.01)
    *G01R 33/563*     (2006.01)
(52) U.S. Cl.
    CPC ...... *G01R 33/5605* (2013.01); *G01R 33/5611* (2013.01); *G01R 33/56341* (2013.01); *G01R 33/56366* (2013.01)
(58) Field of Classification Search
    USPC .......................................................... 324/309
    See application file for complete search history.

(56) References Cited

U.S. PATENT DOCUMENTS

| | | | | |
|---|---|---|---|---|
| 9,655,522 | B2* | 5/2017 | Li | G06K 9/52 |
| 9,964,615 | B2* | 5/2018 | Fuderer | G01R 33/4824 |
| 10,114,099 | B2* | 10/2018 | Taviani | G01R 33/5611 |
| 10,274,567 | B2* | 4/2019 | Takeshima | G01R 33/5611 |
| 10,393,842 | B1* | 8/2019 | Cheng | G01R 33/5608 |
| 10,401,456 | B2* | 9/2019 | De Weerdt | G01R 33/56545 |
| 10,478,639 | B2* | 11/2019 | Lee | A61B 5/4836 |
| 2011/0148413 | A1 | 6/2011 | Miyazaki et al. | |
| 2013/0181711 | A1 | 7/2013 | Chaari et al. | |

OTHER PUBLICATIONS

Written Opinion issued in PCT International Application No. PCT/US2017/026706 completed Jun. 19, 2017.
Basser et al., "MR diffusion tensor spectroscopy and imaging", Biophys J 1994;66(1):259.
Belaroussi et al., "Intensity non-uniformity correction in MRI: existing methods and their validation", Med Image Anal 2006;10(2):234-246.
Bernstein et al., Handbook of MRI pulse sequences: Elsevier; 2004.
Biswal et al., "Functional connectivity in the motor cortex of resting human brain using echo?planar mri", Magn Reson Med 1995;34(4):537-541.
Borthakur et al., "Sodium and T1? MRI for molecular and diagnostic imaging of articular cartilage", NMR Biomed 2006;19(7):781-821.
Bottomley et al, "A review of normal tissue hydrogen NMR relaxation times and relaxation mechanisms from 1-100 MHz: dependence on tissue type, NMR frequency, temperature, species, excision, and age", Med Phys 1984;11:425.
Bottomley et al., "Accelerated Spatially Encoded Spectroscopy of Arbitrarily Shaped Compartments Using Prior Knowledge and Linear Algebraic Modeling", eMagRes 2015;4:89-104.
Chavhan et al., "Principles, Techniques, and Applications of T2*-based MR Imaging and Its Special Applications 1", Radiographics 2009;29(5):1433-1449.
Cleveland, "Robust locally weighted regression and smoothing scatterplots", Journal of the American statistical association 1979;74(368):829-836.
Detre et al., "Perfusion imaging", Magn Reson Med 1992;23(1):37-45.
Dydak et al., "Sensitivity-encoded spectroscopic imaging", Magn Reson Med 2001;46(4):713-722.
Kim et al., "Water saturation shift referencing (WASSR) for chemical exchange saturation transfer (CEST) experiments", Magn Reson Med 2009;61(6):1441-1450.
Posse et al., "MR spectroscopic imaging: principles and recent advances", J Magn Reson Imaging 2013;37(6):1301-1325.
Pruessmann et al., "Advances in sensitivity encoding with arbitrary k-space trajectories", Magn Reson Med 2001;46(4):638-651.
Pruessmann et al., "SENSE: sensitivity encoding for fast MRI", Magn Reson Med 1999;42(5):952-962.
Ward et al., "A new class of contrast agents for MRI based on proton chemical exchange dependent saturation transfer (CEST)", J Magn Reson 2000;143(1):79-87.
Wolff et al., "Magnetization transfer contrast (MTC) and tissue water proton relaxation in vivo", Magn Reson Med 1989;10(1):135-144.
Zhang et al., "Highly accelerated chemical exchange saturation transfer (CEST) measurements with linear algebraic modeling", Magn Reson Med 2015;10.1002/mrm.25873.
Zhang et al., "Highly-accelerated quantitative 2D and 3D localized spectroscopy with linear algebraic modeling (SLAM) and sensitivity encoding", J Magn Reson 2013;237:125-138.
Zhang et al., "Magnetic resonance Spectroscopy with Linear Algebraic Modeling (SLAM) for higher speed and sensitivity", J Magn Reson 2012;218:66-76.
Zhou et al., "Practical data acquisition method for human brain tumor amide proton transfer (APT) imaging", Magn Reson Med 2008;60(4):842-849.

* cited by examiner

| Col 1 | Col 2 | Col 3 | Col 4 | Col 5 | Col 6 | Col 7 | Col 8 | Col 9 |
|---|---|---|---|---|---|---|---|---|
| Patient index | SENSE R=2 | SENSE R=4 | IA vSENSE $S_0$ | IA vSENSE 3.5ppm | AS vSENSE $S_0$ | AS vSENSE 3.5ppm | AS vSENSE $S_0$, Ref | AS vSENSE 3.5ppm, Ref |
| 1 | 0.0346 | 0.0725 | 0.0194 | 0.0182 | 0.0109 | 0.0084 | 0.0090 | 0.0089 |
| 2 | 0.0345 | 0.0809 | 0.0186 | 0.0195 | 0.0101 | 0.0106 | 0.0136 | 0.0100 |
| 3 | 0.0349 | 0.0943 | 0.0177 | 0.0212 | 0.0097 | 0.0203 | 0.0095 | 0.0186 |
| 4 | 0.0328 | 0.0965 | 0.0125 | 0.0210 | 0.0093 | 0.0161 | 0.0096 | 0.0138 |
| 5 | 0.0308 | 0.0439 | 0.0297 | 0.0295 | 0.0170 | 0.0123 | 0.0117 | 0.0100 |
| 6 | 0.0312 | 0.0820 | 0.0164 | 0.0229 | 0.0112 | 0.0153 | 0.0089 | 0.0126 |
| 7 | 0.0322 | 0.0741 | 0.0205 | 0.0311 | 0.0109 | 0.0128 | 0.0092 | 0.0120 |
| 8 | 0.0301 | 0.0540 | 0.0217 | 0.0225 | 0.0109 | 0.0141 | 0.0086 | 0.0125 |
| Mean ± Std | 0.0326 ± 0.0019 | 0.0748 ± 0.0183 | 0.0196 ± 0.0050 | 0.0232 ± 0.0046 | 0.0113 ± 0.0024 | 0.0137 ± 0.0036 | 0.0100 ± 0.0017 | 0.0123 ± 0.0030 |

FIG. 12

METHOD OF FAST IMAGING OF NMR PARAMETERS WITH VARIABLY-ACCELERATED SENSITIVITY ENCODING

This application is a National Stage Application under 35 U.S.C. § 371 of PCT/US2017/026706, filed Apr. 7, 2017, which claims priority to U.S. Provisional Application No. 62/320,197 filed Apr. 8, 2016, the entire content of which is incorporated herein by reference.

This invention was made with Government support under grants EB007829, CA166717, EB009731, NS083435, and EB015555, awarded by the National Institutes of Health. The Government has certain rights in the invention.

BACKGROUND

1. Technical Field

The field of the currently claimed embodiments of this invention relates to imaging of nuclear magnetic resonance (NMR) parameters, and more particularly to imaging of NMR parameters with variably-accelerated sensitivity encoding.

2. Discussion of Related Art

There are many parameters that can be measured by NMR and magnetic resonance imaging (MM) including nuclear spin density, longitudinal relaxation time ($T_1$) (1), longitudinal relaxation time in the rotating frame ($T_{1\rho}$) (2), transverse relaxation time ($T_2$) (1), the inhomogeneously broadened $T_2$ ($T_2^*$) relaxation time (3), apparent diffusion coefficients (ADC) (4), perfusion measures (5), functional MRI (fMRI) measures (6), spectral parameters (7), magnetization transfer ratios (8), and chemical exchange saturation transfer (CEST, including amide proton transfer, APT) indices (9), etc., using hydrogen ($^1H$), carbon ($^{13}C$), fluorine ($^{19}F$), sodium ($^{23}Na$) and phosphorus ($^{31}P$) nuclei of atoms and molecules. These measures can derive from nuclei in endogenous compounds present in biological systems, or from exogenous substances or tracers introduced into the system for the purpose of providing diagnostic, prognostic and/or therapeutic information. In heterogeneous systems, such as the human body or experimental animals, these parameters are often nonuniformly distributed, and therefore it is desirable to obtain measures that are localized to smaller partitions or regions of the system, such as an organ, a lesion, or a pathology within the organ. The standard way to achieve this with MRI is to acquire a nearly continuous distribution of the parameters throughout the sample at the pixel (or voxel) resolution of the image, which, for many parameters, including those named above, requires the acquisition of a plurality of MRI scans wherein a parameter-sensitive variable is changed. This often leads to undesirably long overall acquisition times to perform such measurements that can preclude their acquisition in patient studies, especially when the signal-to-noise ratio (SNR) of the parameter measurement is limited, as is often the case.

We previously described a SLAM (10-13) method to measure compartmental average NMR parameters from user-defined regions of interest. Although the SLAM method can provide dramatic acceleration factors and substantially higher SNR efficiency than conventional methods (10-13), other than by redefining compartments, it cannot distinguish heterogeneous information inside the compartments and is hence limited in applications where intra-compartmental information is needed down to the original pixel/voxel resolution of the image.

Another method of accelerating MRI is the use of sensitivity encoding (SENSE), wherein the NMR/MRI detection coil sensitivity profiles are used in lieu of phase-encoding gradients in MRI to spatially encode the image, thereby allowing those phase-encoding steps to be omitted (14,15). This reduces scan-time while retaining the high-resolution image information provided by the remaining high-spatial frequency phase-encoding MRI gradients. However, application of the SENSE technique to parametric imaging of parameter exhibiting low SNR as compared to the underlying MRI signal being acquired, leads to spatial image 'unfolding' artifacts that limit the acceleration factors that can be practically used.

Accordingly, improved methods of accelerating the measurement and imaging of NMR parameters that can resolve inhomogeneous variations with minimal localization errors or artifacts are needed.

SUMMARY

A method of spatially imaging a nuclear magnetic resonance (NMR) parameter whose measurement requires the acquisition of a plurality of spatially localized NMR signals in a sample according to some embodiments of the invention includes placing the sample in an MRI apparatus with a plurality of MRI detectors each having a spatial sensitivity map; and applying a plurality of MRI sequences wherein each sequence is adjusted to be sensitive to the NMR parameter within the sample. At least one of the plurality of MRI sequences is adjusted so as to substantially fully sample an image k-space of the sample. The remainder of the plurality of MRI sequences is adjusted to under-sample the image k-space of the sample. The method further includes acquiring a plurality of image k-space NMR signal data sets, each responsive to the application of each of the plurality of MRI sequences; estimating a sensitivity map of each of the plurality of MRI detectors using a strategy to suppress unfolding artefacts, wherein the strategy is based on data acquired from the substantially fully-sampled MRI sequence; and applying the estimated sensitivity maps to at least one of the image k-space NMR signal data sets to reconstruct a spatial image of NMR signals that are sensitive to the NMR parameter within a Support Region of the spatial image in which the sample resides.

A system for spatially imaging an NMR parameter whose measurement requires the acquisition of a plurality of spatially localized NMR signals according to some embodiments of the invention includes an NMR system comprising a plurality of MRI detectors, each MRI detector having a spatial sensitivity map; and a processor in communication with the NMR system. The NMR system is configured to apply a plurality of spatially localized MRI sequences, wherein each sequence is adjusted to be sensitive to the NMR parameter within a sample; adjust at least one of the applied plurality of spatially localized MRI sequences so as to substantially fully sample an image k-space of the sample, and adjust the remainder of the applied plurality of spatially localized MRI sequences to under-sample the image k-space of the sample; and acquire a plurality of image k-space NMR signal data sets, each responsive to the application of each of the plurality of spatially localized MRI sequences. The processor is configured to estimate a sensitivity map of each of the plurality of MRI detectors using a strategy to suppress unfolding artefacts, wherein the strategy is based on data acquired from the substantially fully-sampled spatially localized MRI sequence; and apply the estimated sensitivity maps to at least one of the image k-space NMR signal data sets to reconstruct a spatial image of NMR signals that are sensitive to the NMR parameter within a Support Region of the spatial image in which the sample resides.

BRIEF DESCRIPTION OF THE DRAWINGS

Further objectives and advantages will become apparent from a consideration of the description, drawings, and examples.

FIG. 12 is a table showing root normalized mean squared error (RNMSE) for the saturated image at 14 ppm from eight brain tumor patients using accelerated SENSE and vSENSE against full k-space results.

DETAILED DESCRIPTION

Figure 1:
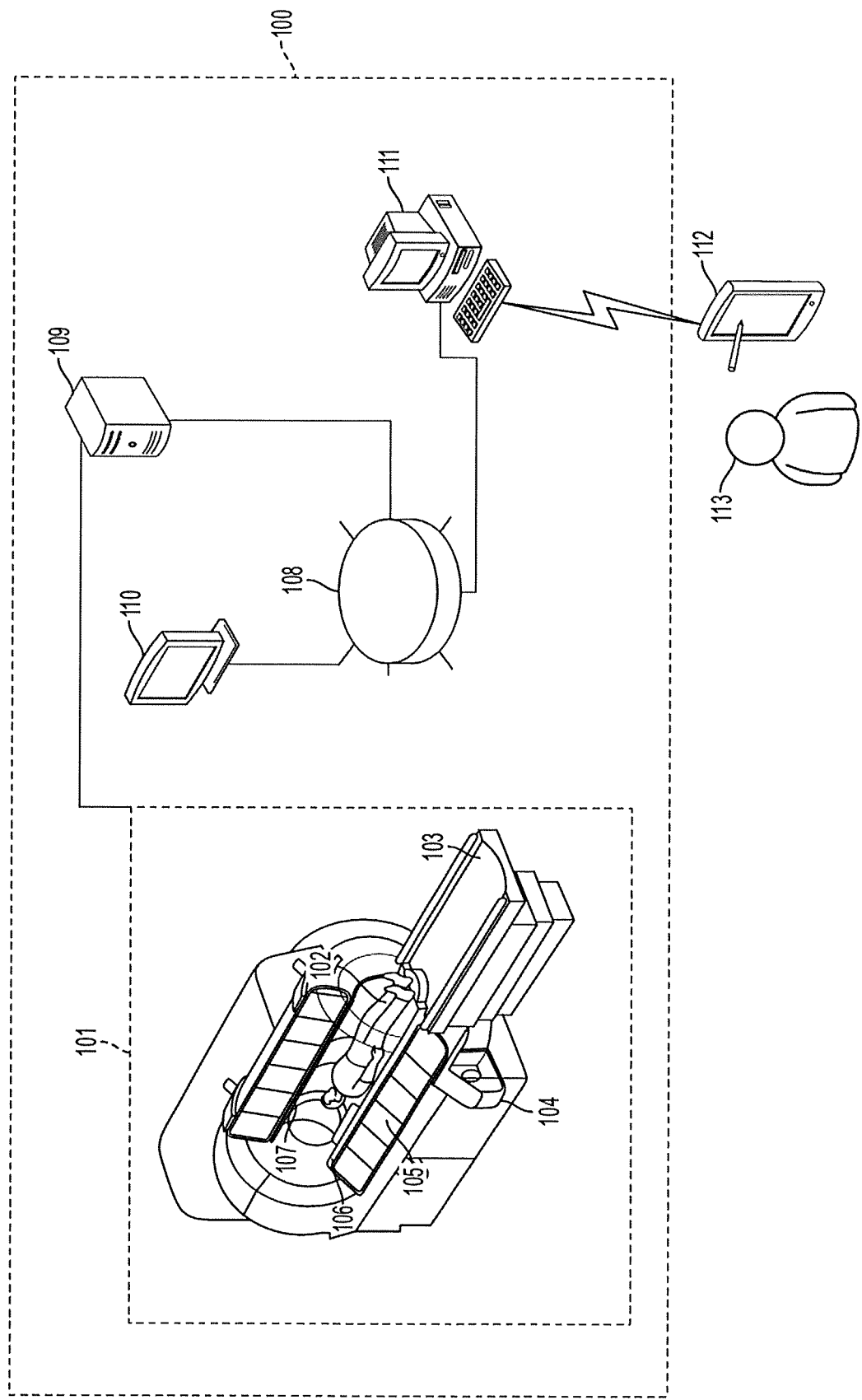
FIG. 1 is a schematic illustration of a system for spatially imaging a nuclear magnetic resonance (NMR) parameter whose measurement requires the acquisition of a plurality of spatially localized NMR signals according to some embodiments of the invention.
Figures 2A, 2B, 2C, 2D:
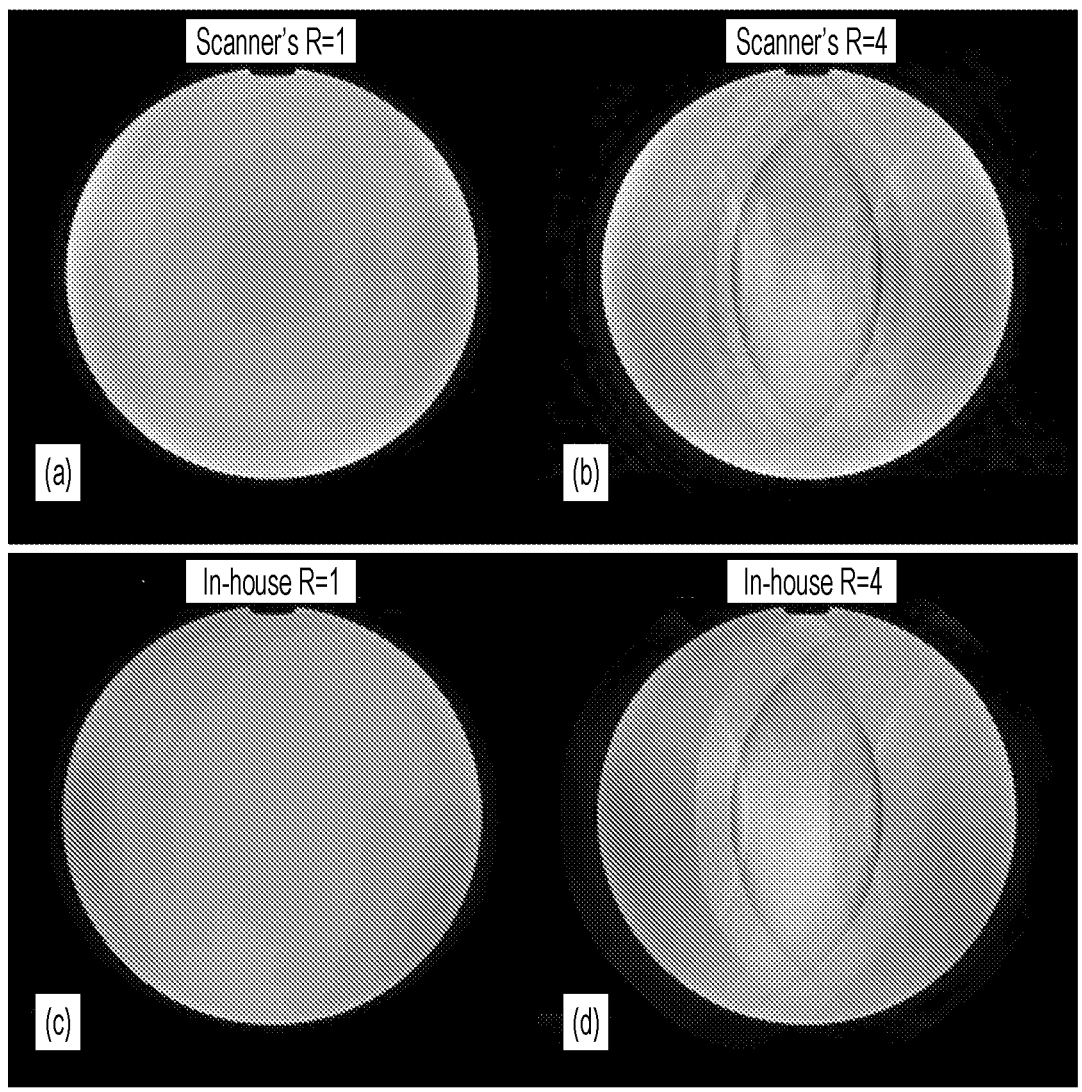
FIGS. 2A-2D show a comparison of saturated images at 3.5 ppm from a doped water phantom, obtained directly from the scanner's and from the authors' in-house implementation of the conventional SENSE method.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

According to some embodiments of the invention, our new method, termed 'variably-accelerated sensitivity encoding' or 'vSENSE,' can be used to measure any or all of the above mentioned parameters in an image pixel-by-pixel or voxel-by-voxel manner as in a conventional MRI experiment, including but not limited to the following: nuclear spin density, relaxation times ($T_1$, $T_{1\rho}$, $T_2$, $T_2^*$), diffusion coefficients, perfusion measures, functional measures, spectral parameters, chemical reaction rates, and chemical exchange saturation transfer (CEST) indices, using hydrogen ($^1$H), carbon ($^{13}$C), fluorine ($^{19}$F), sodium ($^{23}$Na) and phosphorus ($^{31}$P) nuclei. The vSENSE method works for, but is not limited to, applications wherein intra-compartmental information is needed, and can provide a many-fold acceleration factor as compared to conventional MRI. We shall describe first how to use vSENSE to localize any single one of the aforementioned parameters, to any voxel in one to three spatial dimensions. We then present example applications wherein vSENSE is used to measure relaxation times, diffusion coefficients, perfusion measures, and functional indices, and to obtain CEST measurements.

According to some embodiments of the invention, a system for spatially imaging an NMR parameter whose measurement requires the acquisition of a plurality of spatially localized NMR signals in a sample includes an MRI apparatus with a plurality of detectors, and a processor, wherein the system is configured to perform the methods described herein.

The control protocol and algorithms described herein may be implemented by a processor that is associated with an NMR or an MRI system, such as those conventionally used to perform spatially localized NMR or MRI. The processor may be referred to as an image processing system. The processor can be a dedicated "hard-wired" device, or it can be a programmable device. For example, it can be, but is not limited to, a personal computer, a work-station, or any other suitable electronic device for the particular application. In some embodiments, the processor can be integrated into a NMR or MRI unit or it can be attachable or remote with an electronic connection (e.g. via an 'ethernet' or 'WIFI' connection), and/or a distributed processing system in which the processing steps are performed in different sub-parts that communicate electronically via such inter-connections. The processor may also be in communication with a display system for displaying NMR or parametric images.

According to some embodiments of the invention, a method of spatially imaging a nuclear magnetic resonance (NMR) parameter whose measurement requires the acquisition of a plurality of spatially localized NMR signals in a sample includes placing the sample in an MM apparatus with a plurality of MRI detectors each having a spatial sensitivity map. The method further includes applying a plurality of MRI sequences wherein each sequence is adjusted to be sensitive to the NMR parameter within the sample, and wherein at least one of the plurality of MRI sequences is adjusted so as to substantially fully sample an image k-space of the sample, and wherein the remainder of the plurality of MRI sequences is adjusted to under-sample the image k-space of the sample. The method further includes acquiring a plurality of image k-space NMR signal data sets, each responsive to the application of each of the plurality of MRI sequences, and estimating a sensitivity map of each of the plurality of MRI detectors using a strategy to suppress unfolding artefacts, wherein the strategy is based on data acquired from the substantially fully-sampled MRI sequence. The method further includes applying the estimated sensitivity maps to at least one of the image k-space NMR signal data sets to reconstruct a spatial image of NMR signals that are sensitive to the NMR parameter within a defined 'Support Region' of the spatial image in which the sample resides.

According to some embodiments of the invention, the term "substantially fully sampled" is intended to mean sampled by 40% or more, for example.

According to some embodiments of the invention, a plurality of spatial images of NMR signals that are sensitive to the NMR parameter are reconstructed by applying the estimated sensitivity maps, the method further comprising the reconstruction of an image whose intensity is directly proportional to a spatial distribution of the NMR parameter within the sample. According to some embodiments, the method further includes acquiring a reference scan to derive an initial spatial sensitivity map for each of the MRI detectors. According to some embodiments, the strategy to suppress unfolding artefacts is one of an 'Incoherence Absorption' method and an 'Artifact Suppression' method. According to some embodiments employing the Incoherence Absorption method, the estimated sensitivity maps are fitted in the Support Region of the image, and a sensitivity outside the Support Region is assigned based on a calculation of residual incoherent contributions. According to some embodiments employing the Artifact Suppression method, the coil sensitivity maps are fitted in the Support Region of the image, extrapolated outside the Support Region, then scaled by a quotient of images obtained by retroactively undersampling the substantially fully-sampled image k-space of the sample.

According to some embodiments of the invention, the undersampling of the image k-space of the sample is adjusted by increasing the gaps between k-space lines by omitting k-space acquisition steps without changing a full range of k-space that is spanned. According to some embodiments, the undersampling of the image k-space of the sample is adjusted to be one of a uniformly undersampled k-space and a randomly under-sampled k-space, without changing a full range of k-space that is spanned.

According to some embodiments of the invention, the NMR parameter is one of a nuclear spin density, an NMR relaxation time ($T_1$, $T_{1\rho}$, $T_2$, or $T_2^*$), a diffusion coefficient, tissue perfusion, a functional MRI measure, a spectral parameter, and a chemical exchange saturation transfer (CEST) index, and the plurality of MRI sequences is adjusted to cause a corresponding MRI signal to be sensitive to the one of the nuclear spin density, the relaxation time ($T_1$, $T_{1\rho}$, $T_2$, or $T_2^*$), the diffusion coefficient, the perfusion measure, the functional MRI measure, the spectral measure, and the CEST index.

According to some embodiments of the invention, the Support Region is identified via intensity thresholding.

According to some embodiments of the invention, the method further includes reconstructing an image whose intensity is directly proportional to a spatial distribution of the one of the nuclear spin density, the relaxation time ($T_1$, $T_{1\rho}$, $T_2$, or $T_2^*$), the diffusion coefficient, the perfusion measure, the functional MRI measure, the spectral measure, and the CEST index, within the sample.

According to some embodiments of the invention, the corresponding MRI signal is sensitive to a relaxation time and the plurality of MRI sequences comprises pulse sequences in which one or more timing parameters of a pulse sequence repetition period, an inversion time, and an echo time are varied. According to some embodiments, the corresponding MRI signal is sensitive to a diffusion coefficient, and the plurality of MRI sequences comprises sequences in which diffusion weighting pulsed magnetic field gradients are applied. According to some embodiments, the corresponding MRI signal is sensitive to perfusion, and the plurality of MRI sequences comprises at least one sequence in which a slice selective MRI pulse is applied to inflowing blood, and at least one other sequence is applied to outflowing blood. According to some embodiments, the corresponding MRI signal is sensitive to a CEST index, and the plurality of MRI sequences comprises at least one sequence in which a saturation pulse is applied and the frequency of the saturation pulse is adjusted to be at least one of a set of offset frequencies.

According to some embodiments of the invention, the MRI signal data are corrected for inhomogeneity in a main magnetic field ($B_0$).

FIG. 1 shows a system 100 for spatially imaging a nuclear magnetic resonance (NMR) parameter whose measurement requires the acquisition of a plurality of spatially localized NMR signals according to some embodiments of the invention. The system 100 includes an NMR system 101. The NMR system 101 can accommodate a subject 102 under observation on scanner bed 103, for example. The NMR system 101 can include, but is not limited to, a main magnet 105 providing a substantially uniform main magnetic field $B_0$ for a sample (subject or object) 102 under observation on scanner bed 103, a gradient system 106 providing a perturbation of the main magnetic field $B_0$ to encode spatial information of the constituent molecules of subject 102 under observation, and a radiofrequency (RF) coil system 107 to transmit electromagnetic waves and to receive magnetic resonance signals from subject 102. The RF coil system 107 may include a plurality of MRI detectors, such as those provided in an 'MRI phased-array.' Some embodiments of the invention include 16, 32, 60, or 120 MRI detectors, though these numbers are provided as examples, and the embodiments of the invention are not limited to these examples. Each MRI detector has a spatial sensitivity map.

The system 100 also has a processor 109 configured to communicate with the NMR system 101. The processor 109 can be partially or totally incorporated within a structure 104 that houses the NMR system 101 and/or partially or totally incorporated in a workstation that is structurally separate from and in communication with the NMR system 101.

The system 100 can include a data storage unit 108 that can be, for example, a hard disk drive, a network area storage (NAS) device, a redundant array of independent disks (RAID), a flash drive, an optical disk, a magnetic tape, a magneto-optical disk, or that provided by local or remote computer 'cloud' networking, etc. However, the data storage unit 108 is not limited to these particular examples. It can include other existing or future developed data storage devices without departing from the scope of the current invention.

The processor 109 can be configured to communicate with the data storage unit 108. The processor 109 can also be in communication with a display system 110 and/or a console station 111. In some embodiments, results can be displayed by the display system 110 or the console station 111. In some embodiments, an operator 113 may use an input/output device 112 to interact, control, and/or receive results from system 100.

The NMR system 101 is configured to apply a plurality of spatially localized MRI sequences, wherein each sequence is adjusted to be sensitive to an NMR parameter whose measurement requires the acquisition of a plurality of spatially localized NMR signals. The NMR system 101 is configured to adjust at least one of the applied plurality of spatially localized MRI sequences so as to substantially fully sample an image k-space of the sample, and adjust the remainder of the applied plurality of spatially localized MRI sequences to under-sample the image k-space of the sample. The NMR system 101 is configured to acquire a plurality of image k-space NMR signal data sets, each responsive to the application of each of the plurality of spatially localized MRI sequences. The processor 109 is configured to estimate a sensitivity map of each of the plurality of MRI detectors using a strategy to suppress unfolding artefacts, wherein the strategy is based on data acquired from the substantially fully-sampled spatially localized MRI sequence. The processor 109 is configured to apply the estimated sensitivity maps to at least one of the image k-space NMR signal data sets to reconstruct a spatial image of NMR signals that are sensitive to the NMR parameter within a Support Region of the spatial image in which the sample resides.

According to some embodiments of the invention, the NMR system 101 and the processor 109 are associated by one of an Ethernet connection, a Wi-Fi connection, or by integration of the processor 109 into the NMR system 101.

According to some embodiments, the processor 109 is configured to reconstruct an image whose intensity is directly proportional to a spatial distribution of the NMR parameter within the sample 102, and the display system 110 or the console station 111 is configured to display the reconstructed image.

vSENSE differs from the prior art SENSE method in several distinguishing methodological aspects that result in significant amelioration of unfold artifacts. Importantly, the reconstruction accuracy of the SENSE method depends critically on the accuracy of the sensitivity maps used for unfolding. The standard method for generating sensitivity maps (typically preset by the scanner manufacturer) is to acquire a separate reference scan using a low flip-angle, short echo-time, short repetition-time, low-resolution, large field-of-view gradient echo MRI sequence, acquired with the phased-array detector and the scanner's whole-body transmit/receive coils. Because the subsequent imaging scans often use different MRI protocols with different geometric off-sets and orientations from the reference scan, the standard sensitivity maps are rarely accurate. Consequently, the achievable acceleration factor is limited by the need to suppress unfolding artifacts. In contrast, vSENSE uses novel incoherence absorption (IA) and/or artifact suppression (AS) strategies to improve the sensitivity maps, permitting substantially higher acceleration factors than the conventional SENSE method. The proposed IA and AS strategies improve the sensitivity maps using either a separate reference scan or a substantially fully-sampled imaging frame. Furthermore, while the conventional SENSE method uses a constant undersampling factor for all imaging frames, the vSENSE method uses variable undersampling factors for different imaging frames. Thus for example, in the case of vSENSE applied to SENSE (APT) MRI, the method under-samples image k-space less for important saturation offset frequencies (e.g., ±3.5 ppm for APT), and more for other saturation offset frequencies. By means of these novel acquisition and reconstruction methods, vSENSE achieves better accuracy and a higher overall acceleration factor than conventional SENSE.

Methods

The image reconstruction problem using the conventional SENSE algorithm (14) can be cast as the following linear matrix equation, $$s_{Nc*1}=SE_{Nc*R} \times \rho_{R*1} \quad [1]$$

where s is the folded image-space data for one voxel after Fourier transformation in k-space, Nc is the number of receive coil elements, SE is the sensitivity encoding matrix, R is the acquisition acceleration factor, and ρ is the unfolded image-space data for R voxels. Noise pre-whitening (15) can be included in these s and SE matrices without changing the symbols for simplicity. The accuracy of ρ depends critically on the accuracy of SE, as well as the acceleration factor, R, the effect of motion artifacts on s notwithstanding. For R=1, there is no unfolding artifact in the reconstructed ρ matrix, no matter how inaccurate the sensitivity SE matrix is. Thus, reconstructed images using R=1 without unfolding artifacts are treated as accurate here, regardless of the accuracy of the sensitivity weightings. However, unfolding artifacts will appear for R>1 when the sensitivity weightings are inaccurate.

Use of incoherence absorption (IA) to assign sensitivities

One possible approach for obtaining accurate sensitivity maps is to utilize a substantially fully-sampled image frame set by dividing the root-of-the-sum-of-the-squared (RSS) images of all coil channels into the image from each channel. Sensitivity maps calculated in this manner share imaging and geometric parameters identical to those of the imaging scan, and thus can be regarded as accurate. However, three extra aspects must be considered to guarantee accurate unfolded images.

First, the raw sensitivity map from the quotient images of the substantially fully-sampled frame needs to be scaled because the RSS images typically also have a phased-array image shading (16) imposed on them due to the nonuniformity of the detector coil set. The scaling map can be calculated by dividing the RSS phased-array image by a body coil image, obtained from a reference scan, and normalizing it by its maximum value. This scaling map is then applied simultaneously to all the raw sensitivity maps from each individual channel of the substantially fully-sampled image frame. Because the effect of the scaling map factors out of Eq. [1], this process does not introduce any unfolding artifact in the final image, be it accurate or not. Alternatively, other uniformity correction methods (17) such as the use of a homomorphic filter that does not require a reference scan, could be used for scaling. However, the reference scan is fast and is usually implemented automatically at the beginning of any exam session involving phased-array coils, and often cannot be skipped in conventional Mill protocols in any case.

Second, the scaled raw sensitivities can be refined by a locally-weighted (14) polynomial regression (LWPR) or "LOWESS" (18). Here, a "tri-cubic" weighting kernel (18) is used. Fitting can reduce noise in the sensitivity maps. LWPR is implemented in the 'Support Region,' which is defined as the space wherein the object of interest resides. The support region can be identified via intensity thresholding applied to the scaled RSS image acquired from the substantially fully-sampled frame. Isolated holes in the Support Region due to signal dropout (see also below) can be identified via morphological image processing and filled by LWPR.

Third, the extrapolation of sensitivities to the non-Support Region (i.e., the unoccupied image space or 'noise region' or 'non-Support Region') is typically implemented in the conventional SENSE method (14) to deal with the 'bleed' of the spatial response function that typically occurs at the object's edges (19). However, extrapolation does not guarantee the accuracy of unfolded images. For example, FIGS. 2A-2D show a comparison of saturated images at 3.5 ppm from a doped water phantom, obtained directly from the MIII scanner manufacturer's (FIGS. 2A and 2B) and from the inventors' in-house (FIGS. 2C and 2D) implementation of the conventional SENSE method. For FIG. 2A, SENSE acceleration factor R of 1 was prescribed on the scanner. For FIG. 2B, all scanning settings were identical to those in FIG. 2A, except that the R factor was set to 4. For offline, in-house reconstruction, the sensitivity maps were computed from the reference scan after image co-registration and interpolation based on saved geometric parameters. The same sensitivity maps were used for SENSE reconstruction with R=1 (FIG. 2C) and R=4 (FIG. 2D), respectively, using raw k-space data from FIG. 2A.

FIGS. 2A-2D show that both the scanner's and images acquired with R=4 and conventional SENSE routines, exhibit substantial and comparable unfolding artifacts, despite extrapolation of the sensitivity maps that were generated from a reference scan. Therefore we will calculate the sensitivities in the non-Support Region not by extrapolation, but rather, from allocation of the incoherent signal residues. This is called an "incoherence absorption" (IA) approach. Specifically, for a retroactive acceleration factor of two on the substantially fully-sampled image frame, $$s_{NC*1} = SE_{Nc*2} \times \rho_{2*1} = SE_{Nc*1}^1 \times \rho_{1*1}^1 + SE_{Nc*1}^2 \times \rho_{1*1}^2 \quad [2]$$

where $SE^1$ and $SE^2$ refer to the sensitivities in two folded (aliased) voxels, with corresponding values of $\rho^1$ and $\rho^2$, respectively.

Figures 3A, 3B, 3C, 3D, 3E, 3F, 3G, 3H, 3I, 3J, 3K, 3L, 3M:
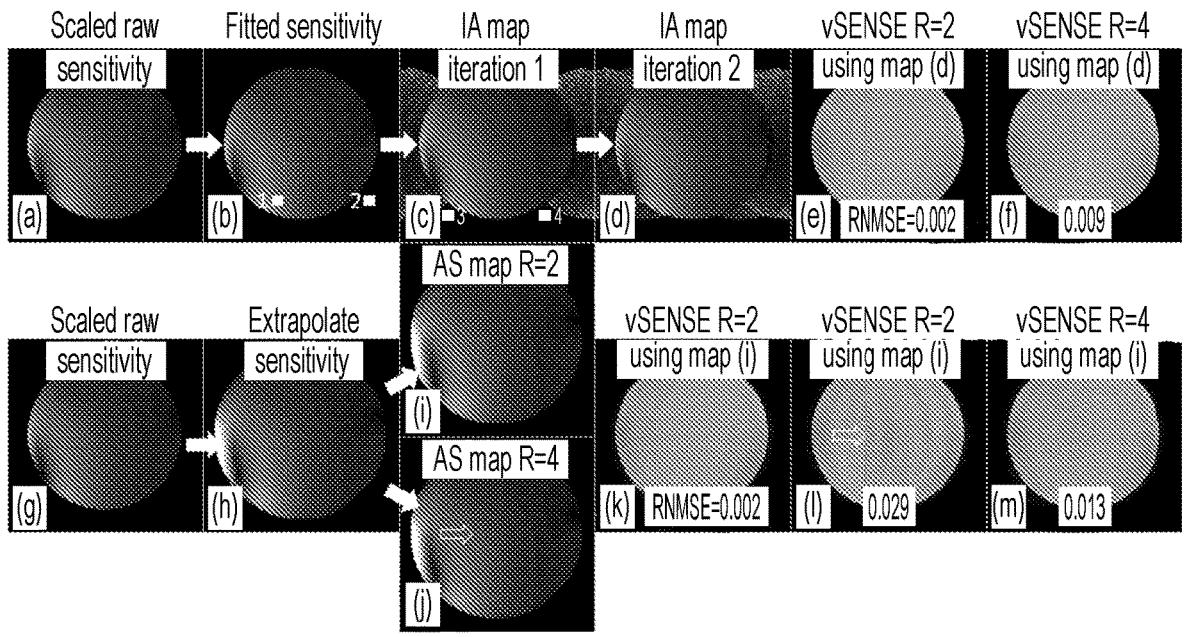
FIGS. 3A-3M show intermediate sensitivity maps calculated from the fully sampled unsaturated $S_0$ frame using the incoherence absorption (a-f) and artifact suppression (g-m) approaches.

FIGS. 3A-3M show intermediate sensitivity maps calculated from the fully sampled unsaturated $S_0$ frame using the incoherence absorption (FIGS. 3A-3F) and artifact suppression (FIGS. 3G-3M) approaches. For the IA approach, the raw sensitivity map was first scaled by a scaling map estimated from the reference scan (FIG. 3A), and then fitted using the LWPR method (FIG. 3B). Then, two IA iterations were implemented using retroactive SENSE acceleration factors of two (FIG. 3C) and four (FIG. 3D) successively. The final IA sensitivity map (FIG. 3D) was used to reconstruct images at 3.5 ppm, with R=2 (FIG. 3E) and R=4 (FIG. 3F). The RNMSE in FIG. 3E and FIG. 3F was computed against the image reconstructed with R=1 using maps, as in FIG. 3D. For the AS approach, the raw sensitivity map was also first scaled (FIG. 3G) as in the IA approach, and then fitted and extrapolated using the LWPR method (FIG. 3H). Then, two AS maps were generated using retroactive SENSE R factors of two (FIG. 3I) and four (FIG. 3J), respectively. These two AS maps were used for reconstructing images at 3.5 ppm with R=2 (FIGS. 3K and 3L) and R=4 (FIG. 3M), respectively. The RNMSE in FIGS. 3K-3M was computed against the image reconstructed with R=1, using maps, as in FIG. 3H. Open arrows denote non-smoothness or unfolding artifacts in the images.

The IA approach targets the situation in which one of the two voxels is in the Support Region (voxel 1) and the other is in the non-Support Region (voxel 2), as shown in FIG. 3B. Then, we can treat $SE^1$ as the known accurate sensitivities, and $SE^2$ as unknown sensitivities. Ideally, there should be no signal in voxel 2 and Eq. [2] would reduce to $s_{Nc*1} = SE_{Nc*1}^1 \times \rho_{1*1}^1$. However, due to bleed from the spatial response function (19) and noise contributions, etc., there will be residual incoherent contributions to Eq. [2], that can be estimated as $s_{NC-1} - SE_{Nc-1}^1 \times \rho_{1*1}^1$. To isolate the effects of incoherent contributions to signals in the Support Region, we can assign the sensitivities in voxel 2 as, $$SE_{Nc*1}^2 = \frac{s_{Nc*1} - SE_{Nc*1}^1 \times \rho_{1*1}^1}{\max_{j=1}^{Nc} |s_{j*1} - SE_{j*1}^1 \times \rho_{1*1}^1|} \times \max_{j=1}^{Nc} |SE_{j*1}^1| \quad [3]$$

where j refers to the coil element index from 1 to Nc. The $\max_{j=1}^{Nc} |s_{j*1}^1 \times \rho_{1*1}^1|$ and $\max_{j=1}^{Nc} |SE_{j*1}^1|$ terms are used to scale the incoherent contributions to the proper sensitivity levels. In Eq. [3], the known sensitivities, $SE^1$, are from scaled and fitted maps, as shown in FIG. 3B, and the known signal, $\rho^1$, is from the regular SENSE reconstruction with R=1, using the scaled and fitted maps. For situations in which two folded voxels are both in the support or the non-Support Regions, their sensitivities do not change. Then, after an iteration of all folded voxels with R=2, the fitted sensitivity map, as shown in FIG. 3B, is extended to an intermediate map, as shown in FIG. 3C. In addition, the newly assigned voxels are added to the Support Region.

Similarly for a retroactive acceleration factor of four, $$s_{Nc*1} = SE_{Nc*4} \times \rho_{4*1} = SE_{Nc*1}^1 \times \rho_{1*1}^1 + SE_{Nc*1}^3 \times \rho_{1*1}^3 + SE_{Nc*1}^4 \times \rho_{1*1}^4 \quad [4]$$

where $SE^1$, $SE^2$, $SE^3$, and $SE^4$ refer to sensitivities in four folded voxels, with corresponding values of $\rho^1$, $\rho^2$, $\rho^3$, and $\rho^4$, respectively. If, and only if, two voxels (e.g., voxels 3 and 4) of the four folded voxels are in the non-Support Region, their sensitivities can be assigned as $$SE_{Nc*1}^3 = SE_{Nc*1}^4 = \quad [5]$$
$$\frac{s_{Nc*1} - SE_{Nc*1}^1 \times \rho_{1*1}^1 * SE_{Nc*1}^2 \times \rho_{1*1}^2}{\max_{j=1}^{Nc} |s_{j*1} - SE_{Nc*1}^1 \times \rho_{1*1}^1 - SE_{Nc*1}^2 \times \rho_{1*1}^2|} \times \max_{j=1}^{Nc} |SE_{j*1}^1|$$

where the known sensitivities, $SE^1$ and $SE^2$, are from intermediate maps, as shown in FIG. 3C and the known signals, $\rho^1$ and $\rho^2$, are from the SENSE reconstruction with R=1 using sensitivity maps shown in FIG. 3B. Then, after the second iteration of all folded voxels with R=4, the fitted sensitivity map shown in FIG. 3C is extended to the final map shown in FIG. 3D.

The maximum retroactive acceleration factor applied to the substantially fully-sampled image frame should be no less than the maximum acceleration factor intended for the other undersampled frames, and the sensitivities can be assigned analogous to Eq. [5] for cases of R>4. In the present demonstration, a retroactive acceleration factor of four was sufficient for vSENSE with R=2 (FIG. 3E) and R=4 (FIG. 3F), resulting in a very small root-normalized-mean-squared-error (RNMSE) with respect to the R=1 case. The RNMSE is defined as $\|x-y\|_2/\|x\|_2$ where x is the reference signal, y is a test signal, and $\|\ \|_2$ denotes the $L^2$ norm.

Before implementing this incoherence absorption approach, the sensitivities in "null" regions of low signal intensity that may arise within the Support Region must be extrapolated as noted under "Second, the scaled raw sensitivities . . . " above. Such null regions could arise for example at locations inside an anatomy such as the head of a subject wherein surgery and lipid suppression in the scalp may result in low signal intensity. Typically, an intensity threshold of 5% of the maximum value could cause null portions of the scalp to be assigned to the non-Support Region. Signal residues measured without properly extrapolating sensitivities in such null regions may be folded into other regions, causing artifacts in the final NMR parameter map. Null regions can be automatically specified by comparing the Support Region masks calculated from the reference scan (which does not use lipid suppression) and the substantially fully-sampled scan. The null regions are then added to the Support Region after sensitivity extrapolation using LWPR.

Use of artifact suppression (AS) to adjust sensitivities

Another approach for the suppression of artifacts in the final unfolded images is to use the substantially fully-sampled scan to adjust sensitivity maps in a self-consistent manner, called an "artifact suppression" (AS) approach. First, an initial raw sensitivity map is required. This can be calculated from the substantially fully-sampled image frame and scaled (FIG. 3G) as in the IA approach, or obtained from the reference scan after image co-registration and interpolation. Second, LWPR is used to fit sensitivities in the Support Region and to extrapolate sensitivities in the non-Support Region (FIG. 3H). Third, the regular SENSE reconstruction is performed with R=1 and the extrapolated sensitivity maps, to produce images without unfolding artifacts.

Fourth, for a retroactive acceleration factor of two (without loss of generality) on the substantially fully sampled frame, $$s_{Nc*1} = [SE^1_{Nc*1} \ SE^2_{Nc*1}] \times \begin{bmatrix} \rho\rho^1_{1*1} \\ \rho\rho^2_{1*1} \end{bmatrix} = \quad [6]$$

$$[SE^1_{Nc*1} \ SE^2_{Nc*1}] \times \begin{bmatrix} A^1_{1*1} & 0 \\ 0 & A^2_{1*1} \end{bmatrix} \times \begin{bmatrix} \rho^1_{1*1} \\ \rho^2_{1*1} \end{bmatrix}.$$

Here, $SE^1$ and $SE^2$ are the potentially inaccurate sensitivities in two folded voxels from the extrapolated sensitivity map; $\rho\rho^1$ and $\rho\rho^2$ are the reconstructed voxel signals solved with R=2 and potentially subject to unfolding artifacts; $\rho^1$ and $\rho^2$ are the accurate voxel signals solved with R=1 above; and $A^1$ and $A^2$ are scaling factors such that $\rho\rho^1_{1*1} = A^1_{1*1} \times \rho^1_{1*1}$ and $\rho\rho^2_{1*1} = A^2_{1*1} \times \rho^2_{1*1}$. Effectively, Eq. [6] scales the fitted and extrapolated sensitivity maps by the quotient of images obtained by retroactively undersampling the substantially fully sampled k-space image. To ensure the accuracy of unfolded images, the sensitivities are adjusted as follows, $$s_{Nc*1} = [SE^1_{Nc*1} \ SE^2_{Nc*1}] \times \begin{bmatrix} \rho\rho^1_{1*1} \\ \rho\rho^2_{1*1} \end{bmatrix} = [SSE^1_{Nc*1} \ SSE^2_{Nc*1}] \times \begin{bmatrix} \rho^1_{1*1} \\ \rho^2_{1*1} \end{bmatrix} \quad [7]$$

where $SSE^1$ and $SSE^2$ are sensitivities that satisfy $SSE^1_{Nc*1} = A^1_{1*1} \times SE^1_{Nc*1}$ and $SSE^2_{Nc-1} = A^2_{1*1} \times SE^2_{Nc-1}$.

Fifth, after running through all the folded voxels with R=2, the extrapolated sensitivity map is adjusted to the map shown in FIG. 3I, and an artifact-free unfolded image in FIG. 3K after SENSE reconstruction. Adjusted sensitivity maps can be generated for R=4, using the same strategies in which Eqs. [6-7] are applied, which despite exhibiting some non-smoothness (FIG. 3J), yields artifact-free unfolded images (FIG. 3M). Note that adjusted sensitivity maps should be computed for each acceleration factor separately (FIGS. 3I and 3J), or unfolding artifacts may ensue (FIG. 3L vs. FIG. 3K).

Choice of a Starting Sensitivity Map

Figures 4A, 4B, 4C, 4D, 4E, 4F, 4G, 4H, 4I, 4J, 4K:
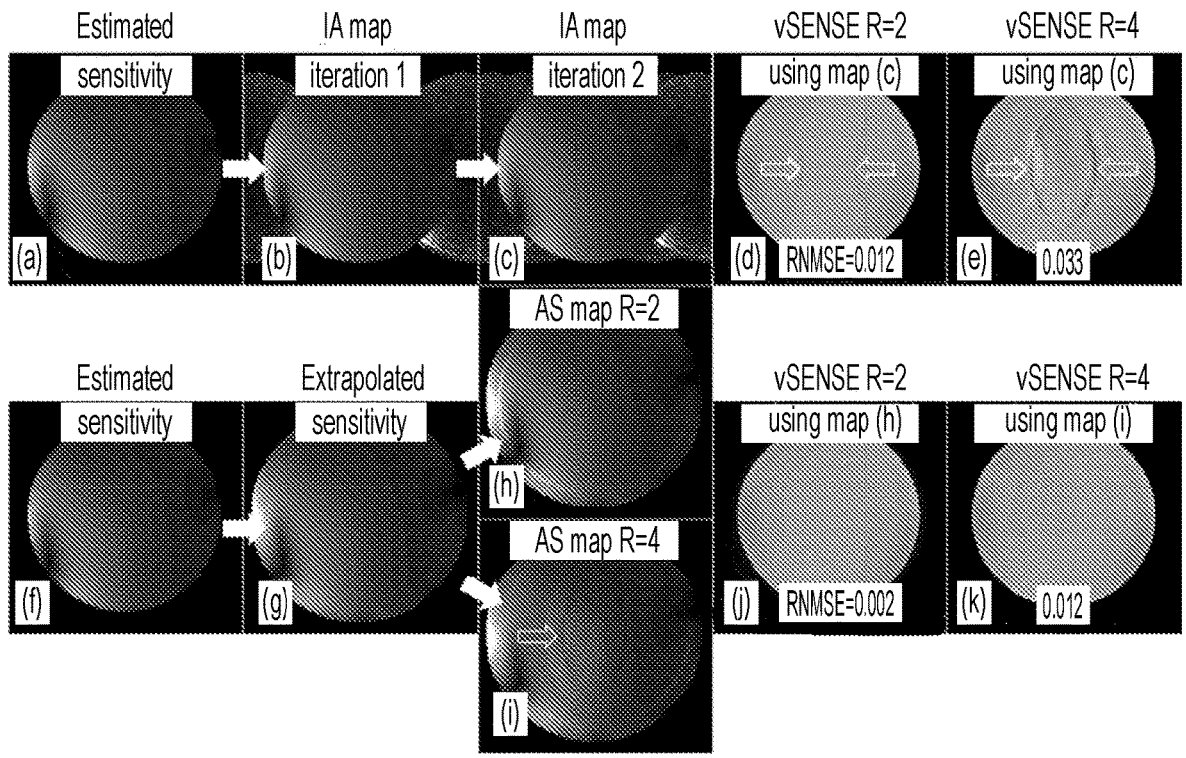
FIGS. 4A-4K show intermediate sensitivity maps calculated from the reference scan using the incoherence absorption and artifact suppression approaches.

FIGS. 4A-4K show intermediate sensitivity maps calculated from the reference scan using the incoherence absorption (FIGS. 4A-4E) and artifact suppression (FIGS. 4F-4K) approaches. For the IA approach, the raw sensitivity map was estimated from the reference scan after image co-registration, interpolation, and fitting (FIG. 4A). Then two IA iterations were implemented using retroactive SENSE acceleration factors of two (FIG. 4B) and four (FIG. 4C) successively. The final IA sensitivity map (FIG. 4C) was used to reconstruct images at 3.5 ppm with R=2 (FIG. 4D) and R=4 (FIG. 4E). The RNMSE in FIGS. 4D and 4E was computed against the image reconstructed with R=1 using maps, as in FIG. 4C. For the AS approach, the raw sensitivity map was first estimated (FIG. 4F), as in the IA approach, and then extrapolated using the LWPR method (FIG. 4G). Then, two AS maps were generated using retroactive SENSE R factors of two (FIG. 4H) and four (FIG. 4I), respectively. These two AS maps were used to reconstruct images at 3.5 ppm with R=2 (FIG. 4J) and R=4 (FIG. 4K), respectively. The RNMSE in FIG. 4J and FIG. 4L was computed against the image reconstructed with R=1 using maps, as in FIG. 4G. Open arrows denote non-smoothness or unfolding artifacts in the images.

Figure 5:
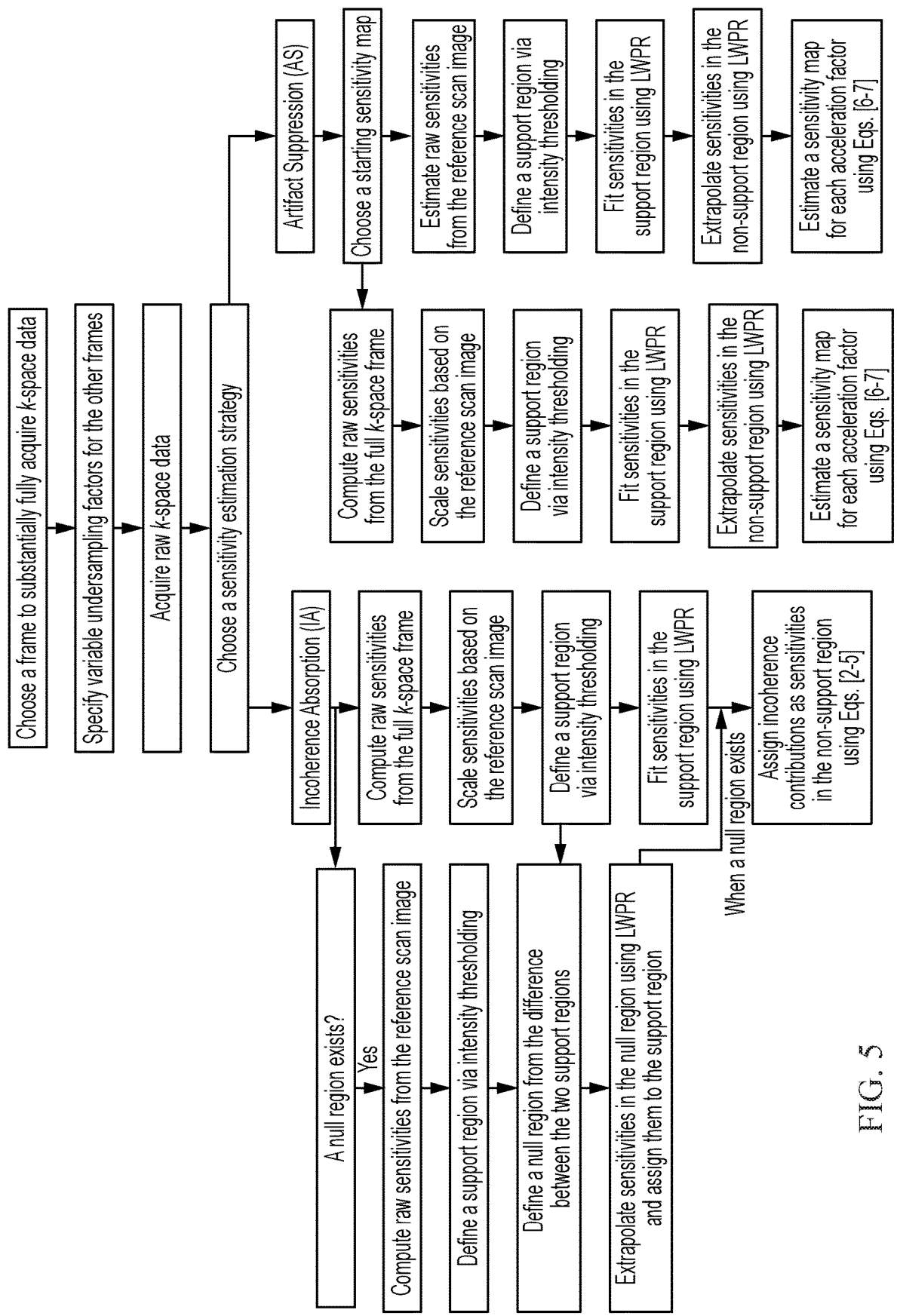
FIG. 5 shows a flowchart for implementing the vSENSE method with sensitivity maps computed using either the incoherence absorption approach or the artifact suppression approach.
Figure 6A:
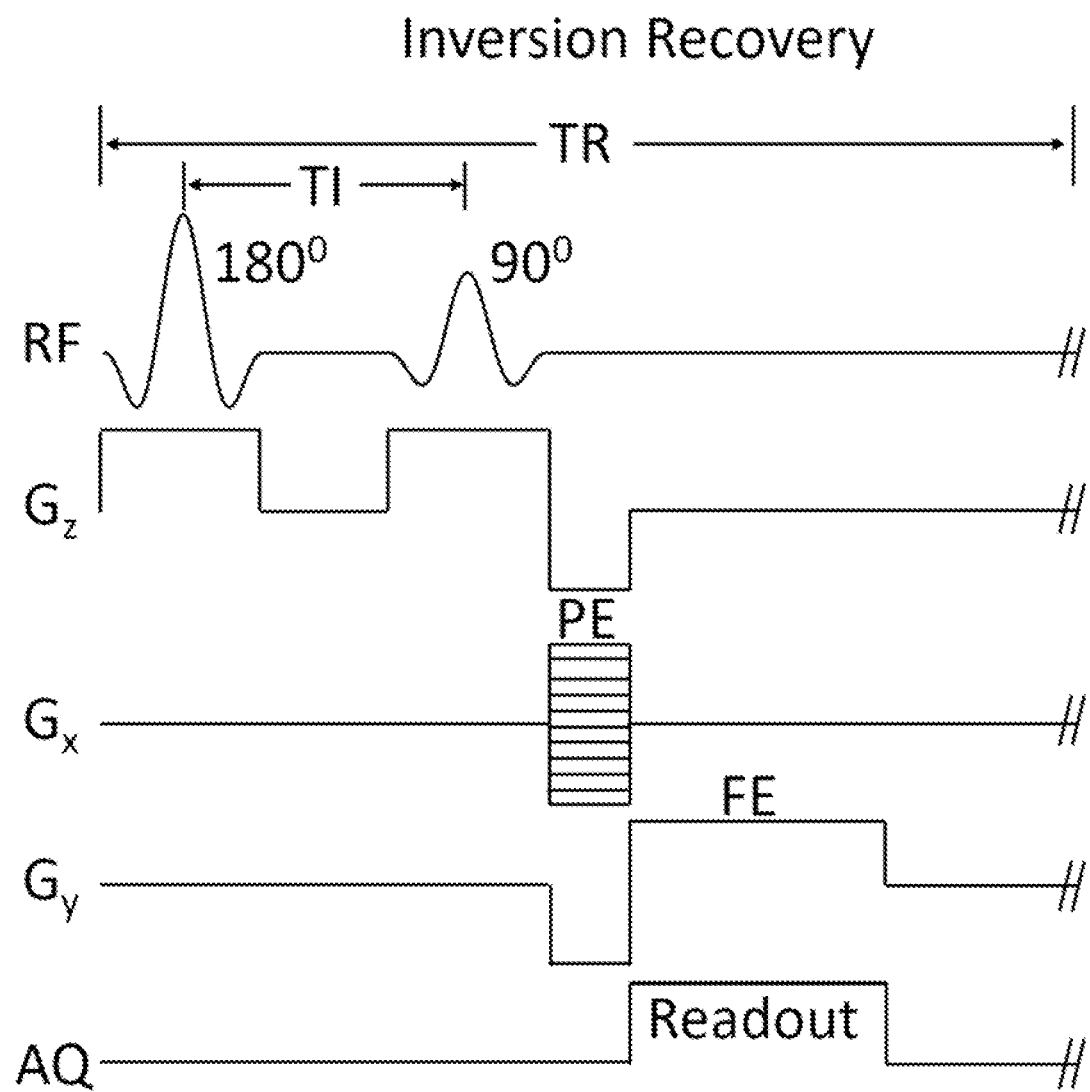
FIG. 6A shows an inversion recovery sequence for measuring relaxation times.
Figure 6B:
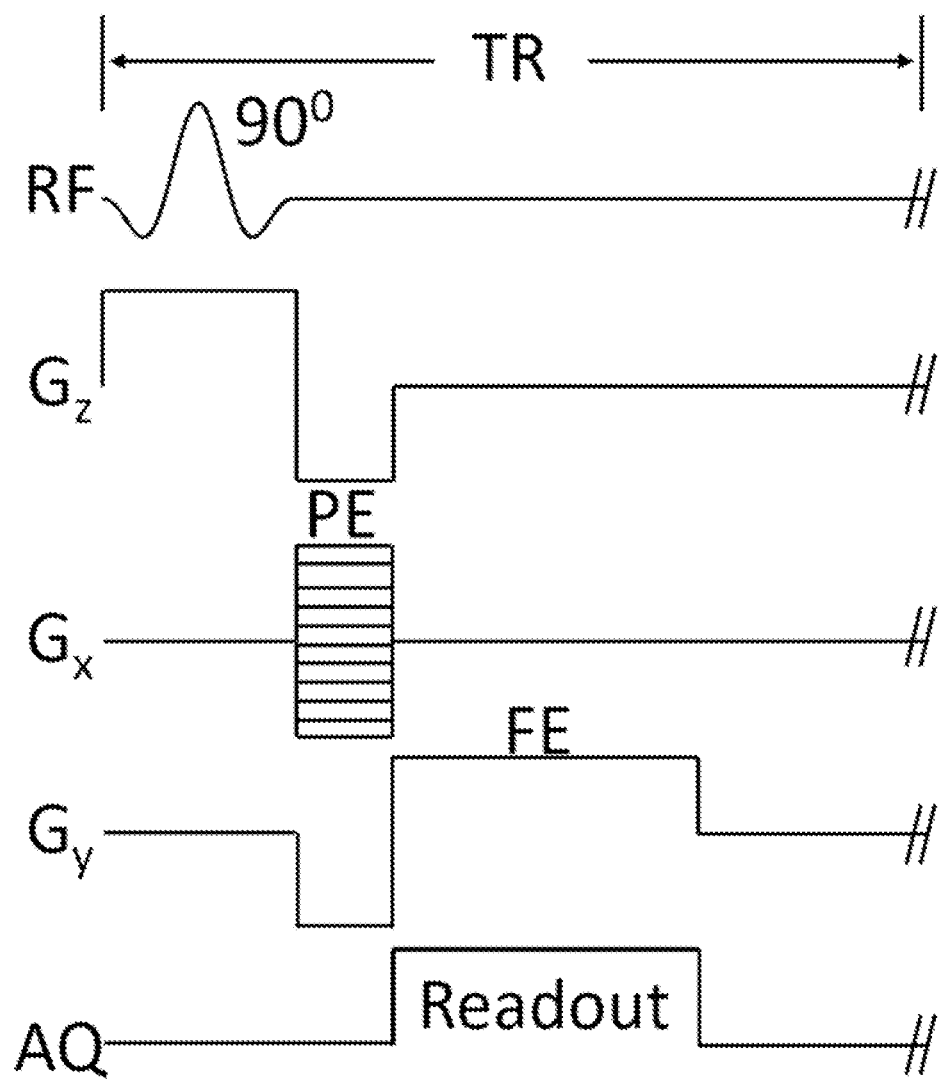
FIG. 6B shows a partial saturation sequence for measuring relaxation times.
Figure 6C:
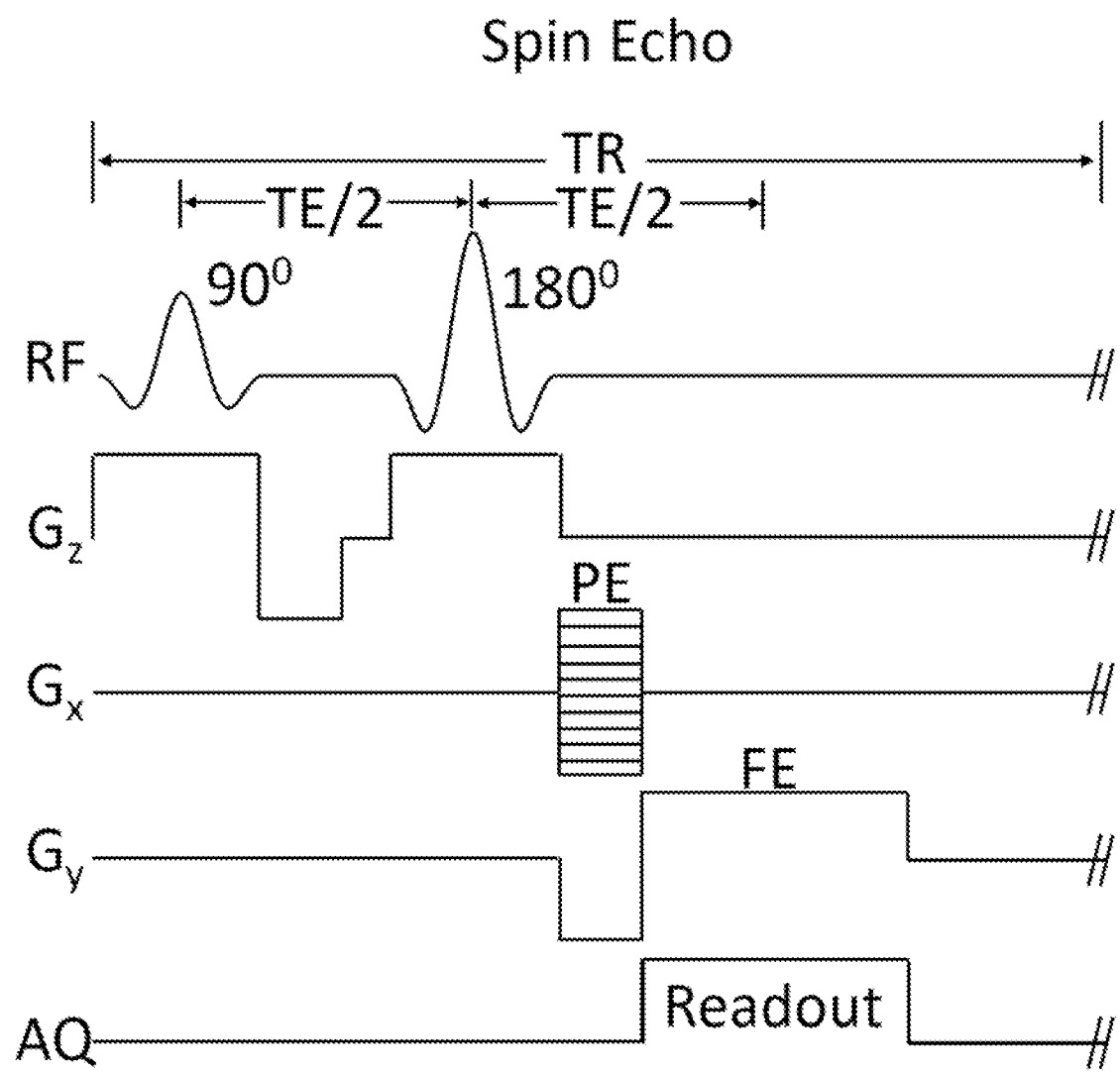
FIG. 6C shows a spin echo sequence for measuring relaxation times.
Figure 6D:
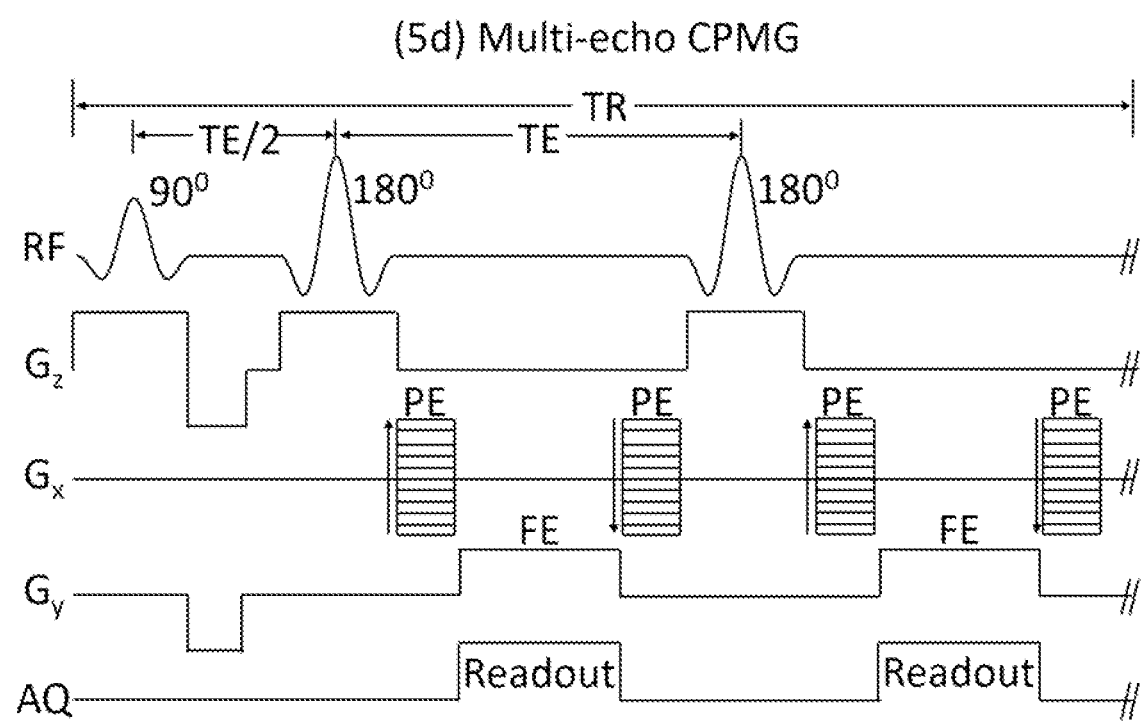
FIG. 6D shows a multi-echo Carr-Purcell (CP) or CP-Meiboom-Gill (CPMG) sequence for measuring relaxation times.
Figure 6E:
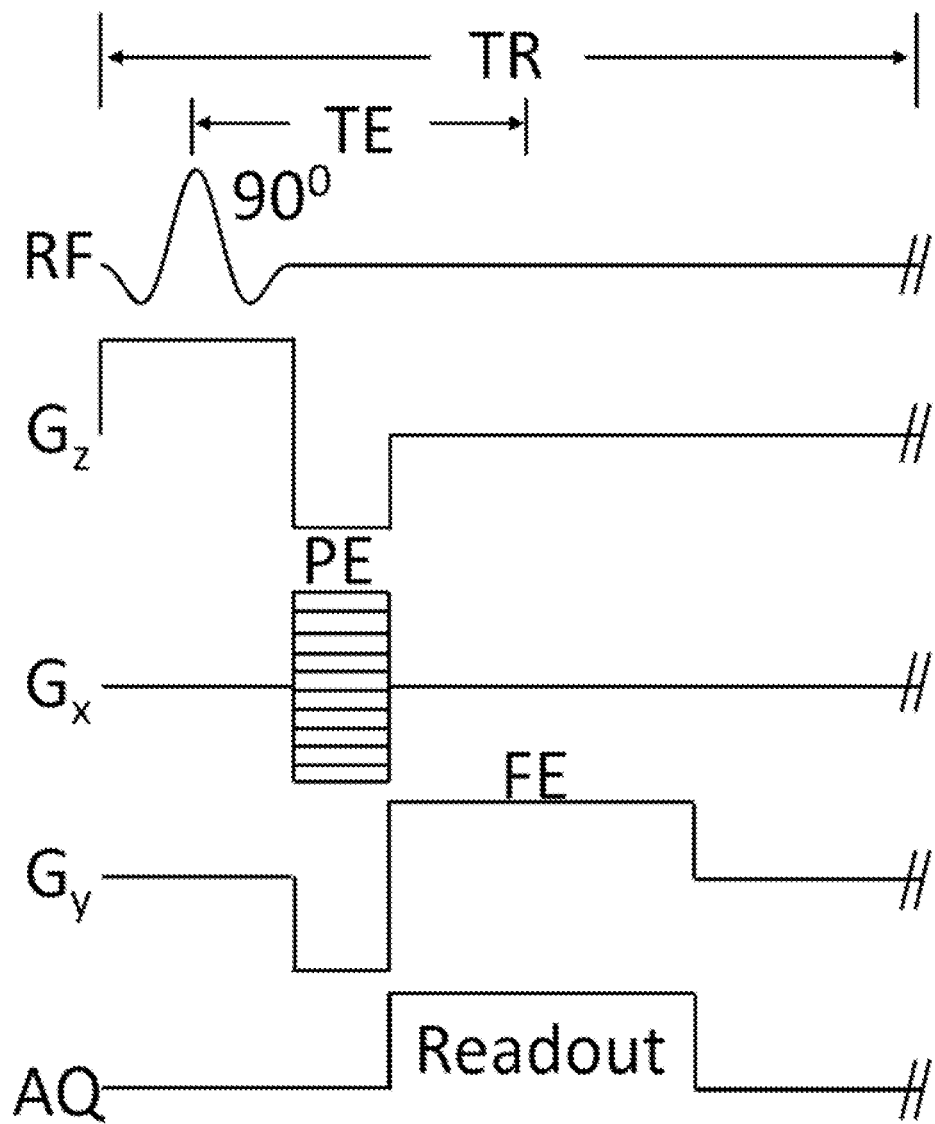
FIG. 6E shows a gradient refocused echo sequence for measuring relaxation times.

The starting sensitivity map for the IA approach can be computed from the substantially fully-sampled image frame (FIGS. 3A-3F). If it is computed from the reference scan, strong unfolding artifacts may occur, as exemplified in FIGS. 4A-4E. However, the AS approach can use sensitivities computed from either the substantially fully-sampled frame (FIGS. 3G-3M) or the reference scan (FIGS. 4F-4K) as the starting sensitivity map. The adjusted map derived from the reference scan (FIG. 3I) exhibits stronger non-smoothness than that from the substantially fully-sampled frame (FIG. 3J) due to its inferior accuracy. The more accurate the starting sensitivity maps are, the closer to unity are the scaling factors, $A^1$ and $A^2$. To ensure stability, the scaling factors are typically delimited to a range of 0.5-1.5. Note however, that the AS approach may fail if the starting map is maldefined and substantially different than the correct map. Both the IA and the AS approaches can require one of the image frames to be substantially fully sampled while the other frames can be undersampled with any customized pattern. A flowchart for implementing the vSENSE method using the IA and AS approaches is shown in FIG. 5.

Application of vSENSE to Measure Relaxation Times

Contrast information predominantly attributed to the distinct relaxation times ($T_1$, $T_{1\rho}$, $T_2$, and $T_2^*$) of different tissues or compartments is the pillar upon which the widespread use of MRI in the clinic and in research stands. However, the durations required for quantitative relaxation time mapping are long, resulting in the compromise use of qualitative relaxation time weighted-MRI in many clinical studies, which limits inter- and intra-institutional reproducibility and comparisons. This sacrifices the potentially useful diagnostic or prognostic information provided by quantitative relaxation time measurements: specific relaxation times are often not even measured, with "$T_1$-weighted," "$T_2$-weighted," and the like, images routinely being used in their stead. However, vSENSE can be used to greatly ameliorate this scan time problem by speeding up the scan-time required for voxel-by-voxel NMR relaxation time measurements.

Specifically, the vSENSE method according to some embodiments of the invention is designed to obtain quantitative voxel-by-voxel $T_1$ measurements. After a sensitivity reference scan is optionally performed, an inversion recovery MRI sequence (FIG. 6A) composed of an inversion MRI pulse with a flip angle (FA) sufficient to invert the nuclear magnetization (e.g., FA ~180°) followed by an MRI excitation pulse (FA≤90°), is applied at an inversion delay time (TI) later. In FIGS. 6A-6E, RF refers to the radiofrequency excitation pulse, PE stands for phase encoding, FE stands for frequency encoding, TE refers to echo time, TI is inversion delay time, TR is repetition time, AQ stands for acquisition, and Gx, Gy and Gz refer to the linear gradient fields in x, y, and z directions, respectively. The sequence is repeated until the spatial encoding is completed for that TI value, from which an image frame can be generated. This process is repeated with a set of different values of TI (e.g. 6 values) that are chosen to span a range of approximately 1 to 3 times the $T_1$ values present in the sample/subject being investigated, to generate a set of $T_1$ weighted image frames as is known by those skilled in the art.

In accordance with the vSENSE method, the image 'k-space' of one frame is substantially fully sampled (e.g. R=1 or 2). For the other frames, the k-space is undersampled by increasing the gap (that is, by omitting one or more of the k-space steps) between the k-space lines that are acquired (that is, R>1, wherein R=2 corresponds to the omission of every second k-space step, R=3 results when 2 k-space steps are omitted for every one acquired etc), The sensitivity maps can be estimated using either the IA (Eqs. [2-5]) or the AS (Eqs. [6-7]) approach from the substantially fully sampled frame and applied to the other undersampled frames as described above. Then, for each TI, a $T_1$-weighted signal from each voxel, ρ, is reconstructed with Eq. [1]. With multiple TI and ρ values available, voxel-by-voxel $T_1$ values are solved by fitting a 3-parameter exponential function, ρ=u−v*exp(−TI/$T_1$), to the set of ρ data acquired at the different TI values, where u, v, and $T_1$ are unknown constants to be determined.

The following describes a vSENSE method according to other embodiments that are designed to obtain quantitative voxel-by-voxel $T_1$ measurements. After an optional sensitivity reference scan, a partial saturation MRI sequence (FIG. 6B) composed of a series of equally spaced MRI excitation pulses with the same FA (typically, FA≤90°) separated in time by the same repetition period, TR, is applied until the NMR signal reaches steady-state and whereupon all the spatial encoding steps are acquired to generate a $T_1$-weighted image. The process is repeated with different values of TR (e.g. 6 values) that span a range of approximately 1 to 3 times the $T_1$ values present in the sample/subject being investigated, as is known by those skilled in the art to generate a set of $T_1$-sensitive NMR image frames. In accordance with the new vSENSE method, the k-space of one frame of the set is substantially fully sampled (R=1), while in the other frames, the k-space is undersampled by increasing the gap between k-space lines (R>1, by omitting k-space acquisitions as described above for the inversion recovery $T_1$ method). The sensitivity maps can be estimated using either the IA (Eqs. [2-5]) or the AS (Eqs. [6-7]) approach from the substantially fully sampled frame and applied to the other undersampled frames as described above. Then, for each TR value, a $T_1$-weighted signal from each voxel, ρ, is reconstructed using Eq. [1]. With multiple TR and ρ values available, voxel-by-voxel $T_1$ values are then solved by fitting a 3-parameter exponential function, ρ=u−v*exp(−TR/$T_1$), to the set of ρ data acquired at the different TR values, where u, v, and $T_1$ are (generally different) unknown constants to be determined.

The vSENSE method according to some embodiments of the invention is designed to obtain quantitative voxel-by-voxel $T_2$ measurements. After an optional sensitivity reference scan, a single echo time (TE) MRI sequence (FIG. 6C) is used with vSENSE. The sequence is composed of an MRI excitation pulse (typical FA≤90°) followed by an echo-producing pulse with FA substantially equal to 180° at time TE/2. The sequence is repeated until the spatial encoding is completed for that TE value, from which an image frame whose signal is sensitive to $T_2$ is generated. The process is then repeated with different echo times TE to generate a set of $T_2$-weighted image frames, as is known by those skilled in the art. In accordance with the vSENSE method, the k-space of one frame is substantially fully sampled (e.g. R=1 or 2). For the other frames, the k-space is undersampled by increasing the gap between k-space lines (R>1, by omitting k-space steps, as above), with different values of TE (e.g. 6 values) that span a range of time of approximately 1 to 3 times the $T_2$ values present in the sample/subject being investigated to generate a set of $T_2$ parameter-sensitive MRI data. The sensitivity maps can be estimated using either the IA (Eqs. [2-5]) or the AS (Eqs. [6-7]) approach from the substantially fully sampled frame and applied to the other undersampled frames as described above. For each TE value, a $T_2$-weighted signal from each voxel, ρ, is reconstructed using Eq. [1]. Then, the known TE and ρ values are fitted to a 2-parameter exponential function, ρ=w*exp(−TE/$T_2$) where w is an unknown constant, and solved to obtain the $T_2$ of each voxel.

The vSENSE method according to other embodiments of the invention is designed to obtain quantitative voxel-by-voxel $T_2$ measurements. After an optional sensitivity reference scan, a multiple echo time (TE) MRI sequence (FIG. 6D) is used with vSENSE. A sequence known as "Carr-Purcell" (CP) or "CPMG" by those skilled in the art, is composed of an MRI excitation pulse (typical FA≤90°) followed by series of $n_e$ echo-producing pulses with FA substantially equal to 180°, repeated at intervals of TE, starting at time TE/2 after the excitation pulse, with spatial encoding gradients for each echo. In a conventional $T_2$ MRI sequence, the series of echoes acquired in a single application of the CP/CPMG sequence in FIG. 6D, would continue until there is inadequate SNR for acquiring further $T_2$-weighted signals, for example, due to $T_2$ decay. After that the sequence would be reapplied with remaining spatial encoding steps until encoding was complete and a full image could be reconstructed. This process produces multiple acquisitions in which spin echoes are both spatially encoded and $T_2$ weighted. In accordance with the vSENSE method the k-space spanned by one of set these $T_2$ acquisitions corresponding to one $T_2$-weighted image frame, is substantially fully sampled (e.g. R=1 or 2) whereas the k-space in the other frames is undersampled by increasing the gap between k-space lines (R>1, by omitting k-space steps, as above), with different values of TE (e.g. 6 values) that span a range of time of approximately 1 to 3 times the $T_2$ values present in the sample/subject being investigated. The sensitivity maps can be estimated using either the IA (Eqs. [2-5]) or the AS (Eqs. [6-7]) approach from the substantially fully sampled frame and applied to the other undersampled frames as described above. For each $T_2$-weighted signal recorded at each TE value, a voxel-by-voxel MRI signal value, ρ, is reconstructed using Eq. [1]. Then, the known TE and ρ values for the $n^{th}$ echo are fitted to a 2-parameter exponential function, ρ=w*exp(−n*TE/$T_2$), where w is an unknown constant, and solved to obtain $T_2$ images.

The vSENSE method according to other embodiments of the invention is designed to obtain quantitative voxel-by-voxel $T_2$* measurements. After an optional sensitivity reference scan, a gradient refocused echo MRI sequence (FIG. 6E) composed of a series of equally spaced MRI excitation pulses is applied with the same FA (typically, FA≤90°) to generate a gradient refocused echo at time TE later. The sequence is repeated until the spatial encoding is completed for that TE value, from which an image frame whose signal is sensitive to $T_2^*$ is generated. The process is then repeated with different echo times TE to generate a set of $T_2^*$-weighted image frames, as is known by those skilled in the art. In accordance with the vSENSE method the k-space of one frame substantially fully sampled (e.g. R=1 or 2). For the other frames, the k-space is undersampled by increasing the gap between k-space lines (R>1, by omitting k-space acquisitions), with different values of TE that approximately span the range of $T_2^*$ values in the sample. The sensitivity maps can be estimated using either the IA (Eqs. [2-5]) or the AS (Eqs. [6-7]) approach from the substantially fully sampled frame and applied to the other undersampled frames as described above. Then, for each TE value, a value of the $T_2^*$-weighted signal from each voxel, ρ, is reconstructed using Eq. [1]. With multiple TE and ρ values available, compartmental-average $T_2^*$ values are solved by fitting a 3-parameter exponential function, $ρ=u-v^*exp(-TE/T_2^*)$, to the set of ρ data acquired at the different TE values where u, v, and $T_2^*$ are unknown constants to be determined.

$T_{1ρ}$ can be measured similarly in further embodiments of this invention wherein the $T_1$ and $T_2$ sensitive MRI sequences are replaced by a $T_{1ρ}$ MRI sequence as is known by those skilled in the art, implemented with the vSENSE under-sampling acquisition wherein the k-space of one frame is substantially fully sampled while other frames are undersampled, and the vSENSE reconstruction methods to provide a dramatic reduction in scan time for the voxel-by-voxel measurement.

Application of vSENSE to Measure Diffusion Indices (ADC)

The following describes the vSENSE method according to some other embodiments of the invention, in which the method is designed to obtain quantitative voxel-by-voxel measures of the ADCs. After an optional sensitivity reference scan, a diffusion-weighted MRI sequence such as is known by those skilled in the art is used with the vSENSE method used for undersampling and reconstruction as described above. A conventional MRI diffusion sequence is composed of an MRI excitation pulse (typical FA≤90°) followed by an echo-producing pulse with FA substantially equal to 180° bracketed by pairs of diffusion-weighting gradient pulses. The gradient amplitude-time integral of each of the pair of pulses before and after the 180° pulse (measured as "b-values", in s/mm$^2$) is equal. The sequence is applied repeatedly with the same gradient amplitude-time pulse pair until the spatial encoding is complete and a diffusion-weighted image frame can be reconstructed as is known by those skilled in the art. This procedure is then repeated with different values of the gradient amplitude-time pulse pair (executed by changing the amplitude and/or duration of the diffusion-weighting gradient) to generate a series of image frames with different diffusion weightings. In accordance with application of the vSENSE method, the k-space of one frame is substantially fully sampled (e.g. R=1 or 2). For the other frames, the k-space is undersampled by increasing the gap between k-space lines (R>1, by omitting k-space acquisitions as above), with a range of different b-values that match the range of the ADCs (in mm$^2$/s) present in the sample/subject being investigated. The sensitivity maps can be estimated using either the IA (Eqs. [2-5]) or the AS (Eqs. [6-7]) approach from the substantially fully sampled frame and applied to the other undersampled frames as described above. For each diffusion weighted signal recorded at each b-value, a voxel-by-voxel MRI signal value, ρ, is reconstructed using Eq. [1]. Then, the known b-value and ρ values are fitted to a 2-parameter exponential function, $ρ=w^*exp(-b^*ADC)$, where w is an unknown constant, and solved to obtain the ADC of each voxel.

Application of vSENSE to Measure Perfusion Indices

The vSENSE method according to some embodiments of the invention is designed to obtain quantitative voxel-by-voxel perfusion measures. After an optional sensitivity reference scan, an arterial spin labeling (ASL) MRI sequence is used with vSENSE. In prior art, ASL MRI is used to measure tissue perfusion by deploying an MRI protocol wherein a first MRI frame is acquired with a spatially selective pulse turned on (the "labeling" pulse) and applied to a site of inflowing blood to the tissue of interest. This involves repeating the labeling sequence until all MRI spatial encoding is complete. Then a second MRI frame is acquired either with the labeling pulse turned off or applied equidistant from the tissue of interest as the labeling pulse, on a site of outflowing blood (the "control"): again the control sequence is repeated until the control image is fully-encoded. The labeling pulse is applied at a location from the tissue of interest commensurate with the range of influx rates of the arterial blood that infuses it. Subtraction of the labeled image from the control image provides a tissue perfusion measure. In accordance with embodiments wherein vSENSE is used to obtain quantitative voxel-by-voxel perfusion measurements, the ASL sequence is implemented with spatial selective labeling and control pulses, but with one frame substantially fully-sampled and the other frame(s) undersampled in accordance with the vSENSE method described above. The sensitivity maps can be estimated using either the IA (Eqs. [2-5]) or the AS (Eqs. [6-7]) approach from the substantially fully sampled frame and applied to the other undersampled frames as described above. For each of the label and control acquisitions, a voxel-by-voxel MRI signal value, ρ, can be reconstructed using Eq. [1]. Then, the subtraction of the two ρ values gives a voxel-by-voxel perfusion measurement.

Application of vSENSE to Measure Functional Indices

The vSENSE method according to some other embodiments of the invention is designed to obtain quantitative voxel-by-voxel functional information. After an optional sensitivity reference scan, a blood oxygenation level dependent (BOLD) imaging sequence of the type known by those skilled in the art is used with the vSENSE acquisition and reconstruction method. The sequence is composed of an MM excitation pulse (typical FA≤90° followed by an echo-planar readout scheme, with the k-space of one frame substantially fully sampled (e.g. R=1 or 2). For the other frames, the k-space is undersampled by increasing the gap between k-space lines (R>1, by omitting k-space acquisitions as above), to generate a set of BOLD-sensitive MRI data. The sensitivity maps can be estimated using either the IA (Eqs. [2-5]) or the AS (Eqs. [6-7]) approach from the substantially fully sampled frame and applied to the other undersampled frames as described above. For each BOLD-sensitive signal at each time point, a voxel-by-voxel MRI signal value, ρ, is reconstructed using Eq. [1]. Then, functional indices can be extracted from the time series of each voxel using the general linear model.

Application of vSENSE to Measure CEST Indices

The vSENSE method according to some other embodiments of the invention is designed to obtain quantitative voxel-by-voxel CEST measures of which APT represents an exemplary subclasss. After an optional sensitivity reference scan, a CEST MRI sequence is used with vSENSE. The conventional CEST experiment can use a gradient refocused echo or spin-echo sequence (e.g., in FIGS. 6C-6E), except that the sequence is preceded with a frequency (or chemically) selective saturation NMR pulse. The frequency of the saturation is advanced in repeat applications of the sequence to generate a set of CEST parameter-sensitive NMR images. The variation of the signal in each pixel as a function of saturation frequency is known as the "z-spectrum," and asymmetry in the z-spectra about the water resonance may have potential diagnostic value (9). In accordance with the vSENSE method, the CEST sequence is applied with the k-space of one frame substantially fully sampled (e.g. R=1 or 2) and with the k-space of the other frames undersampled by increasing the gap between k-space lines (R>1). The sensitivity maps can be estimated using either the IA (Eqs. [2-5]) or the AS (Eqs. [6-7]) approach from the substantially fully sampled frame and applied to the other undersampled frames as described above. For each CEST-sensitive signal recorded at each saturation frequency, a voxel-by-voxel MRI signal value, ρ, is reconstructed using Eq. [1]. Then, a voxel-by-voxel CEST index or z-spectrum is obtained. The nominal saturation frequency offset in the vSENSE CEST images is corrected for the main magnetic field ($B_0$) inhomogeneity using the same methods used in conventional CEST studies (20,21).

Figures 7A, 7N:
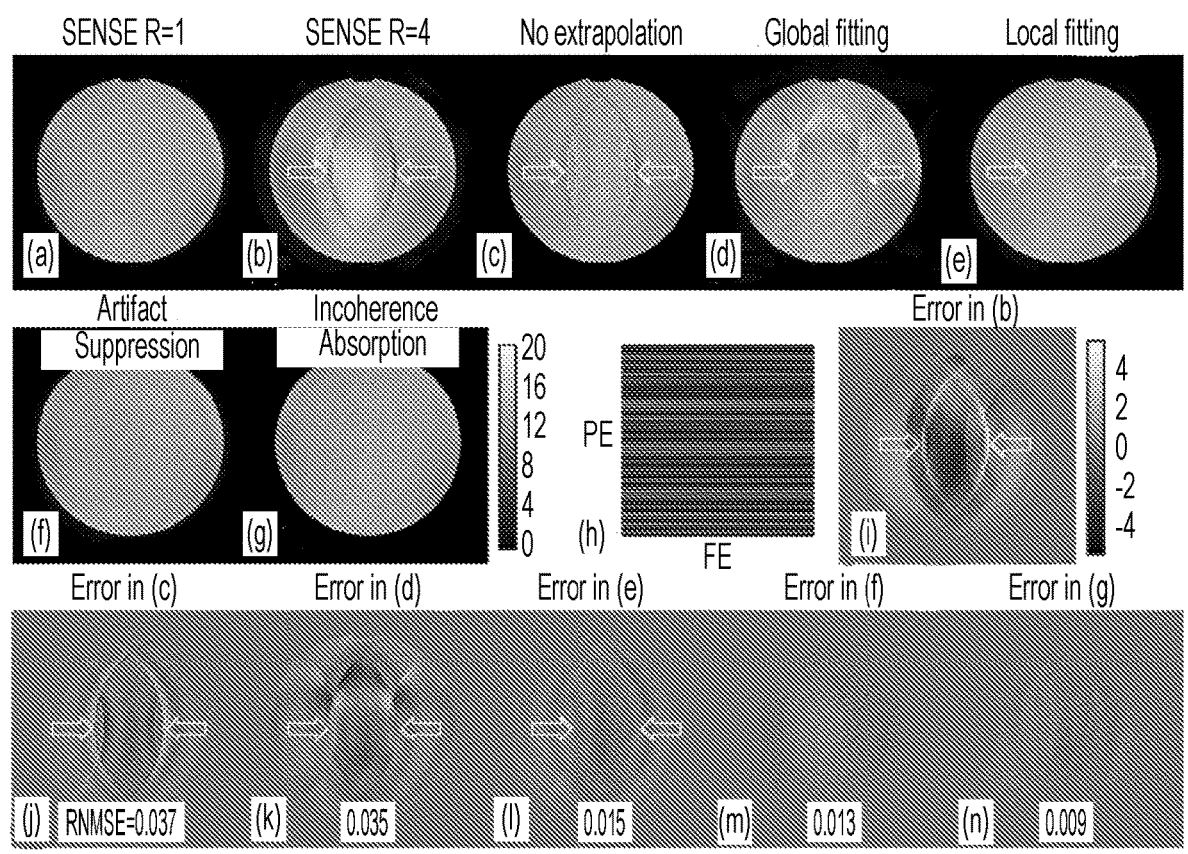
FIGS. 7A-7N show a comparison of saturated images at 3.5 ppm from a doped water phantom using different acceleration factors and different sensitivity map sources.

FIGS. 7A-7N show a comparison of saturated images at 3.5 ppm from a doped water phantom using different acceleration factors (R=1 for FIG. 7A; R=4 for FIGS. 7B-7G) and different sensitivity map sources (from the reference scan for FIGS. 7A and 7B; from the $S_0$ frame for FIGS. 7C-7G). In FIGS. 7A and 7B, for regular SENSE, reconstruction with a constant undersampling factor for all frames was used, with unfolding errors shown in FIG. 7I. In FIGS. 7C-7G, for vSENSE, frames were undersampled variably, i.e., R=1 for $S_0$ and R=4 for the other frames, with sensitivity maps from using LWPR only in the support region (FIG. 7C), a $7^{th}$ order global polynomial fitting (FIG. 7D), LWPR in both the support and the non-support regions (FIG. 7E), AS (FIG. 7F), and IA (FIG. 7G). Difference maps in FIGS. 7J-7N were computed against R=1 results with corresponding sensitivity maps. The k-space undersampling pattern for R=4 is shown in FIG. 7H. Open arrows indicate non-smooth artifacts.

FIGS. 7A-7N show that the accelerated conventional SENSE method (FIG. 7B), using sensitivity maps from the reference scan, had a much greater error (FIG. 7I) than those (FIGS. 7J-7N) using sensitivities estimated from the fully-sampled $S_0$ scan (FIGS. 7C-7G). FIGS. 7C and 7J confirm (19) that there was a larger error when no extrapolation was performed in the non-Support Region than when extrapolation was implemented (FIGS. 7D-7G and 7K-7N). For fitting and extrapolation, the local fitting method (FIGS. 7E and 7L) substantially outperformed the global fitting method (FIGS. 7D and 7K). However, results from the AS (FIGS. 7F and 7M) and IA (FIGS. 7G and 7N) approaches had the smallest error of all strategies.

Figures 8A, 8N:
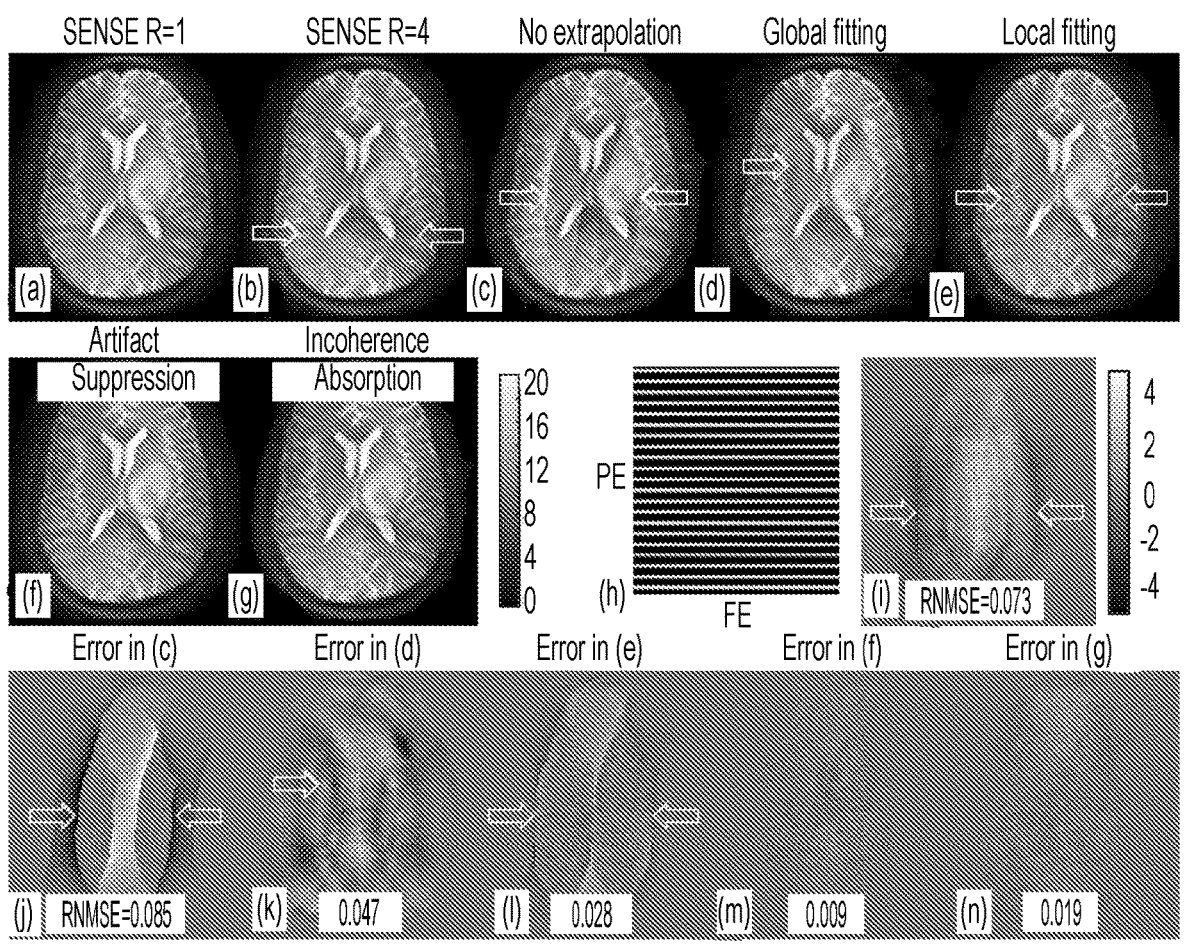
FIGS. 8A-8N show a comparison of saturated images at 14 ppm from a brain tumor patient using different acceleration factors and different sensitivity map sources.

FIGS. 8A-8N show a comparison of saturated images at 14 ppm from a brain tumor patient using different acceleration factors (R=1 for FIG. 8A; R=4 for FIGS. 8B-8G) and different sensitivity map sources (from the reference scan for FIGS. 8A and 8B; from the $S_0$ frame for FIGS. 8C-8G). In FIGS. 8A and 8B, for regular SENSE, reconstruction with a constant undersampling factor for all frames was used, with unfolding errors shown in part (i). In FIGS. 8C-8G, for vSENSE, frames were undersampled variably, i.e., R=1 for $S_0$ and R=4 for the other frames, with sensitivity maps from using LWPR only in the support region (FIG. 8C), a $6^{th}$ order global polynomial fitting (FIG. 8D), LWPR in both the support and the non-support regions (FIG. 8E), AS (FIG. 8F), and IA (FIG. 8G). Difference maps in FIGS. 8J-8N were computed against R=1 results with corresponding sensitivity maps. The k-space undersampling pattern for R=4 is shown in FIG. 8H. Open arrows indicate non-smooth artifacts.

FIGS. 8A-8N illustrate results from a brain tumor patient, where the current standard implementation of SENSE using a separate reference scan (FIG. 8B) resulted in a substantial error (FIG. 8I) compared to the fully sampled image (FIG. 8A). As in the phantom results (FIGS. 7A-7N), the local fitting method (FIGS. 8E and 8L) generated a smaller error than the global fitting method (FIGS. 8D and 8K), both using sensitivity maps calculated form the fully-sampled $S_0$ scan. Again, both the AS (FIGS. 8F and 8M) and IA (FIGS. 8G and 8N) methods outperformed the other methods. In contrast to the phantom results, where the IA approach had a smaller error, the AS method yielded a smaller RNMSE than the IA method for the patient data.

FIG. 12 is a table showing root normalized mean squared error (RNMSE) for the saturated image at 14 ppm from eight brain tumor patients using accelerated SENSE and vSENSE against full k-space results. Images from accelerated SENSE were obtained from constantly undersampled data (R=1 for column 2; R=4 for column 3) using sensitivity maps calculated from the reference scan. Images from accelerated vSENSE were obtained from variably undersampled data, i.e., R=1 for $S_0$ and R=4 for the other frames (columns 4, 6, 8), or R=1 for the first 3.5 ppm frame and R=4 for the other frames (columns 5, 7, 9), using either the IA approach (columns 4-5) or the AS approach (columns 6-9). As for the AS approach, the starting sensitivity maps were either from the fully sampled frame (columns 6-7) or from the reference scan (columns 8-9).

The table in FIG. 12 lists the results of the 6 possible combinations for implementing the vSENSE method, in 8 brain tumor patients. The 6 combinations based on the flowchart in FIG. 5 are: the IA approach with either (i) the $S_0$ scan, or (ii) the 3.5 ppm scan fully sampled (columns 4-5); the AS approach with (iii) the fully-sampled $S_0$, or (iv) fully-sampled 3.5 ppm scan as the starting sensitivity map (columns 6-7) but no reference scan; and the AS approach with either (v) the $S_0$ scan or (vi) the 3.5 ppm scan fully sampled, but using the reference scan as the starting sensitivity map (columns 8-9). Sensitivity maps from all 6 vSENSE strategies (columns 4-9) generated a smaller error ($P \leq 0.02$) than the regular SENSE with R=4 (column 3) and even with R=2 (column 2). Among the six strategies, the AS approach with the $S_0$ frame fully sampled and the use of the reference scan (column 8) resulted in a significantly smaller error than the others ($P \leq 0.02$ vs. columns 4-5; $P \approx 1$ vs. columns 6, 7 and 9). The reduction in error for vSENSE with R=4 was 3-fold and 6-fold vs. conventional SENSE with R=2 and R=4, respectively (columns 8-9 vs. 2-3).

FIGS. 9A-9J show anatomical (FIGS. 9A and 9B) and APT-weighted (FIGS. 9C-9J) images from a brain tumor patient. APT-weighted images from regular SENSE (R=1 for FIG. 9C; R=4 for FIG. 9D) were obtained using sensitivity maps calculated from the reference scan. APT-weighted images from vSENSE were obtained from variably undersampled data, i.e., R=1 for $S_0$, R=2 for the ±3.5 ppm frames and R=4 for the other frames (FIGS. 9E, 9G, and 9I), or R=1 for the first 3.5 ppm frame, R=2 for the rest ±3.5 ppm frames and R=4 for the other frames (FIGS. 9F, 9H, and 9I), using either the IA (FIGS. 9E-9F) or the AS (FIGS. 9G-9J)

approach. As for the AS approach, the starting sensitivity maps were either from the fully sampled frame (FIGS. 9G and 9H) or from the reference scan (FIGS. 9I and 9J).

Figures 9A, 9B, 9C, 9D, 9E, 9F, 9G, 9H, 9I, 9J:
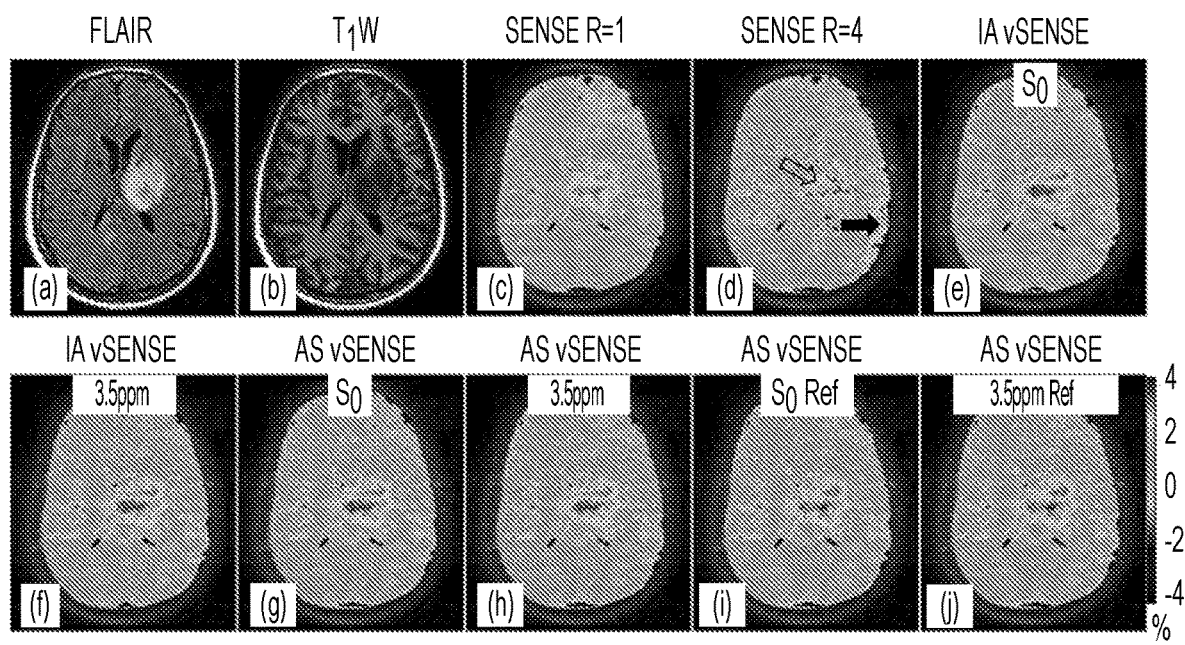
FIGS. 9A-9J show anatomical and APT-weighted images from a brain tumor patient.
Figures 10A, 10B, 10C, 10D, 10E, 10F, 10G, 10H:
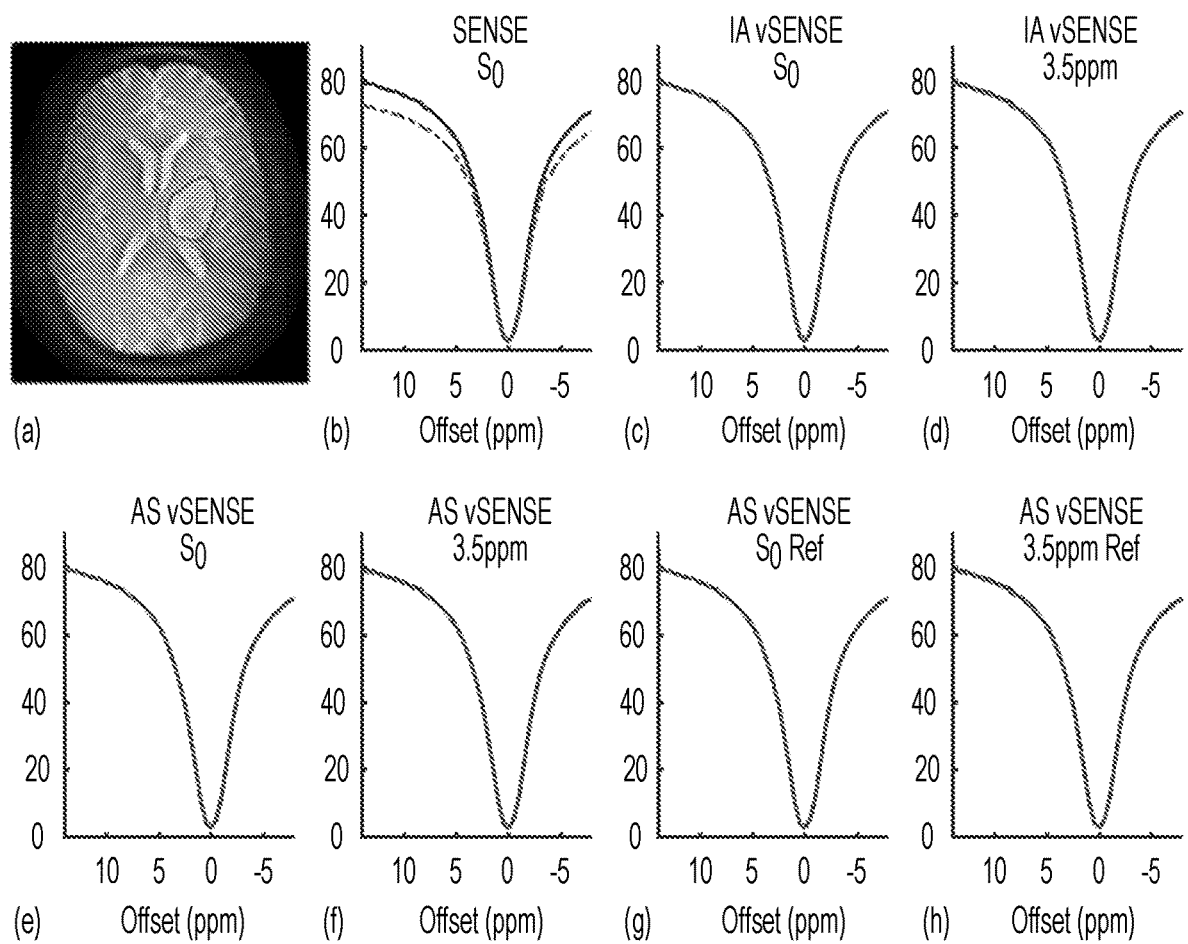
FIGS. 10A-10H show Z-spectra in a selected region of interest obtained from accelerated SENSE and vSENSE (dashed spectra) vs. full k-space results (solid spectra).

FIGS. 9A-9J demonstrate typical results from a case in which conventional SENSE with a constant undersampling factor of four (FIG. 9D), produced corrupted APT-weighted images, as compared to the full k-space results (FIG. 9C; open and solid arrows in the tumor and periphery indicate SENSE-reconstruction artifacts vs. FIG. 9C). In contrast, the vSENSE method with variable acceleration and an overall acceleration factor of R=4, generated APT-weighted images (FIGS. 9E-9J) highly consistent with the full k-space data (FIG. 9C), for all six combinations of strategies, as reflected by the results from all patients reported in the table in FIG. 12.

FIGS. 10A-10H show Z-spectra in a selected region of interest obtained from accelerated SENSE and vSENSE (dashed spectra) vs. full k-space results (solid spectra). Solid z-spectra in FIGS. 10B-10H were from regular SENSE with R=1 using sensitivity maps estimated from the reference scan. Both accelerated SENSE and vSENSE used variably undersampled data, i.e., R=1 for $S_0$, R=2 for the ±3.5 ppm frames and R=4 for the other frames (FIGS. 9B, 9C, 9E, and 9G), or R=1 for the first 3.5 ppm frame, R=2 for the rest ±3.5 ppm frames and R=4 for the other frames (FIGS. 9D, 9F, and 9H). As for the AS approach, the starting sensitivity maps were either from the fully sampled frame (FIGS. 9E and 9F) or from the reference scan (FIGS. 9E and 9H).

FIGS. 10A-10H demonstrate that the conventional SENSE method with sensitivity maps calculated from the reference scan would produce a substantial error (≤9.4%) in the compartmental z-spectrum (dashed in FIG. 10B) vs. the full k-space spectrum (solid in FIG. 10B), if implemented in a variable acceleration fashion, i.e., R=1 for the S0 frame, R=2 for the ±3.5 ppm frames, and R=4 for the other CEST saturation frames. On the contrary, the vSENSE method produced z-spectra (dashed in FIGS. 10C-10H) indistinguishable from the full k-space spectrum (solid in FIGS. 10C-10H), using sensitivity maps based on the six different methods reported in Table 1.

Figures 11A, 11B, 11C, 11D, 11E, 11F, 11G, 11H:
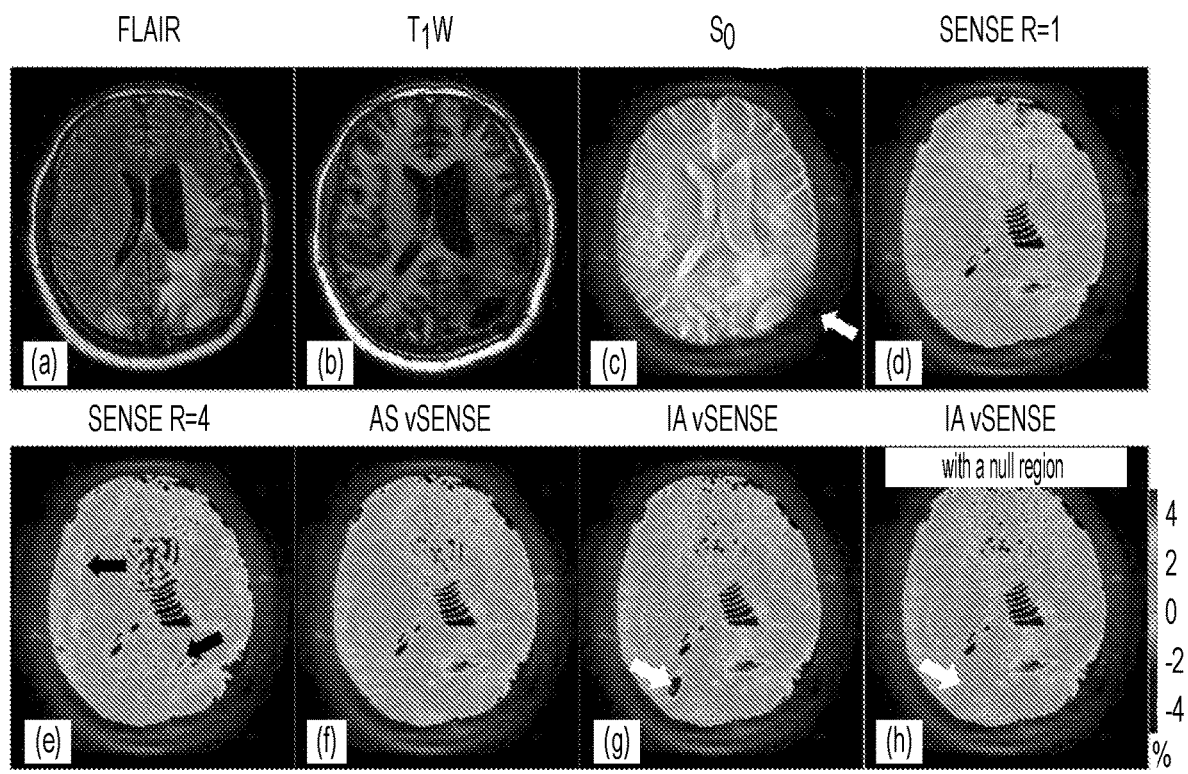
FIGS. 11A-11H show anatomical, unsaturated CEST frame, and APT-weighted images from a brain tumor patient.

FIGS. 11A-11H show anatomical (FIGS. 11A and 11B), unsaturated CEST frame (FIG. 11C), and APT-weighted (FIGS. 11D-11H) images from a brain tumor patient. APT-weighted images from regular SENSE (R=1 for part d; R=4 for FIG. 11E) were obtained using sensitivity maps calculated from the reference scan. APT-weighted images from vSENSE were obtained from variably undersampled data, i.e., R=1 for $S_0$, R=2 for the ±3.5 ppm frames and R=4 for the other frames (FIGS. 11F-11H), using either the AS approach (FIG. 11F) or the AS approach (FIGS. 11G and 11H). For the AS approach, the starting sensitivity maps were from the reference scan (FIG. 11F). For the IA approach, sensitivity maps were computed either without (FIG. 11G) or with (FIG. 11H) the null region, as identified by the solid white arrow in FIG. 11C.

FIGS. 11A-11H present a special case where prior surgery and fat suppression caused a signal null region in the scalp (FIG. 11C; solid white arrow, on $S_0$ image). This null region causes substantial artifacts (FIG. 11G; open arrow) if not extrapolated according to the flowchart in FIG. 5. However, with extrapolation, both the AS (FIG. 11F) and IA (FIG. 11H) approaches yield APT-weighted maps that are consistent with the full k-space map (FIG. 11D), while regular SENSE with R=4 shows substantial artifacts (FIG. 11E; black arrows).

vSENSE can accelerate the voxel-by-voxel acquisition of NMR and MRI measurements many-fold. The vSENSE method generates more accurate sensitivity maps, and permits a higher overall acceleration factor with smaller errors than is achievable with conventional SENSE. vSENSE can be applied to accelerate measurement of NMR parameters including relaxation times, diffusion, perfusion, functional, and CEST indices.

REFERENCES

1. Bottomley P A, Foster T H, Argersinger R E, Pfeifer L M. A review of normal tissue hydrogen NMR relaxation times and relaxation mechanisms from 1-100 MHz: dependence on tissue type, NMR frequency, temperature, species, excision, and age. Med Phys 1984; 11:425.
2. Borthakur A, Mellon E, Niyogi S, Witschey W, Kneeland J B, Reddy R. Sodium and T1ρ MRI for molecular and diagnostic imaging of articular cartilage. NMR Biomed 2006; 19(7):781-821.
3. Chavhan G B, Babyn P S, Thomas B, Shroff M M, Haacke E M. Principles, Techniques, and Applications of $T_2^*$-based MR Imaging and Its Special Applications 1. Radiographics 2009; 29(5):1433-1449.
4. Basser P J, Mattiello J, LeBihan D. MR diffusion tensor spectroscopy and imaging. Biophys J 1994; 66(1):259.
5. Detre J A, Leigh J S, Williams D S, Koretsky A P. Perfusion imaging. Magn Reson Med 1992; 23(1):37-45.
6. Biswal B, Zerrin Yetkin F, Haughton V M, Hyde J S. Functional connectivity in the motor cortex of resting human brain using echo-planar mri. Magn Reson Med 1995; 34(4):537-541.
7. Posse S, Otazo R, Dager S R, Alger J. MR spectroscopic imaging: principles and recent advances. J Magn Reson Imaging 2013; 37(6):1301-1325.
8. Wolff S D, Balaban R S. Magnetization transfer contrast (MTC) and tissue water proton relaxation in vivo. Magn Reson Med 1989; 10(1):135-144.
9. Ward K, Aletras A, Balaban R. A new class of contrast agents for MRI based on proton chemical exchange dependent saturation transfer (CEST). J Magn Reson 2000; 143(1):79-87.
10. Zhang Y, Heo H Y, Jiang S, Lee D H, Bottomley P A, Zhou J. Highly accelerated chemical exchange saturation transfer (CEST) measurements with linear algebraic modeling. Magn Reson Med 2015; 10.1002/mrm.25873.
11. Zhang Y, Gabr R E, Schar M, Weiss R G, Bottomley P A. Magnetic resonance Spectroscopy with Linear Algebraic Modeling (SLAM) for higher speed and sensitivity. J Magn Reson 2012; 218:66-76.
12. Zhang Y, Gabr R E, Zhou J, Weiss R G, Bottomley P A. Highly-accelerated quantitative 2D and 3D localized spectroscopy with linear algebraic modeling (SLAM) and sensitivity encoding. J Magn Reson 2013; 237:125-138.
13. Bottomley P A, Zhang Y. Accelerated Spatially Encoded Spectroscopy of Arbitrarily Shaped Compartments Using Prior Knowledge and Linear Algebraic Modeling. eMagRes 2015; 4:89-104.
14. Pruessmann K P, Weiger M, Scheidegger M B, Boesiger P. SENSE: sensitivity encoding for fast MRI. Magn Reson Med 1999; 42(5):952-962.
15. Pruessmann K P, Weiger M, Bornert P, Boesiger P. Advances in sensitivity encoding with arbitrary k-space trajectories. Magn Reson Med 2001; 46(4):638-651.
16. Bernstein M A, King K F, Zhou X J. Handbook of MRI pulse sequences: Elsevier; 2004.

17. Belaroussi B, Milles J, Carme S, Zhu Y M, Benoit-Cattin H. Intensity non-uniformity correction in MRI: existing methods and their validation. Med Image Anal 2006; 10(2):234-246.
18. Cleveland W S. Robust locally weighted regression and smoothing scatterplots. Journal of the American statistical association 1979; 74(368):829-836.
19. Dydak U, Weiger M, Pruessmann K P, Meier D, Boesiger P.
Sensitivity-encoded spectroscopic imaging. Magn Reson Med 2001; 46(4):713-722.
20. Zhou J, Blakeley J O, Hua J, Kim M, Laterra J, Pomper M G, van Zijl P. Practical data acquisition method for human brain tumor amide proton transfer (APT) imaging. Magn Reson Med 2008; 60(4):842-849.
21. Kim M, Gillen J, Landman B A, Zhou J, van Zijl P. Water saturation shift referencing (WASSR) for chemical exchange saturation transfer (CEST) experiments. Magn Reson Med 2009; 61(6):1441-1450.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified, varied, or combined without departing from the invention, as appreciated by those skilled in the art in light of the above teachings. It is therefore to be understood that, within the scope of the claims and their equivalents, the invention may be practiced otherwise than as specifically described.

We claim:

1. A method of spatially imaging a nuclear magnetic resonance (NMR) parameter whose measurement requires the acquisition of a plurality of spatially localized NMR signals in a sample, comprising:
    placing the sample in an MRI apparatus with a plurality of MRI detectors each having a spatial sensitivity map;
    applying a plurality of MRI sequences wherein each sequence is adjusted to be sensitive to said NMR parameter within the sample, and wherein
        at least one of the plurality of MRI sequences is adjusted so as to substantially fully sample an image k-space of the sample, and,
        the remainder of said plurality of MRI sequences is adjusted to under-sample the image k-space of the sample;
    acquiring a plurality of image k-space NMR signal data sets, each responsive to the application of each of said plurality of MRI sequences;
    estimating a sensitivity map of each of the plurality of MRI detectors using a strategy to suppress unfolding artefacts,
        wherein said strategy is based on data acquired from the substantially fully-sampled MRI sequence; and
    applying the estimated sensitivity maps to at least one of the image k-space NMR signal data sets to reconstruct a spatial image of NMR signals that are sensitive to said NMR parameter within a Support Region of the spatial image in which the sample resides.

2. The method of claim 1, wherein a plurality of spatial images of NMR signals that are sensitive to said NMR parameter are reconstructed in said applying the estimated sensitivity maps, the method further comprising reconstructing an image whose intensity is directly proportional to a spatial distribution of said NMR parameter within the sample.

3. The method of claim 1, further comprising acquiring a reference scan to derive an initial spatial sensitivity map for each of said MRI detectors.

4. The method of claim 1, wherein said strategy to suppress unfolding artefacts is one of an Incoherence Absorption method and an Artifact Suppression method.

5. The method of claim 1, wherein the undersampling of the image k-space of the sample is adjusted by increasing the gaps between k-space lines by omitting k-space acquisition steps without changing a full range of k-space that is spanned.

6. The method of claim 1, wherein the undersampling of the image k-space of the sample is adjusted to be one of a uniformly undersampled k-space and a randomly undersampled k-space, without changing a full range of k-space that is spanned.

7. The method of claim 1, wherein the NMR parameter is one of a nuclear spin density, an NMR relaxation time ($T_1$, $T_{1\rho}$, $T_2$, or $T_2^*$), a diffusion coefficient, tissue perfusion, a functional MRI measure, a spectral parameter, and a chemical exchange saturation transfer (CEST) index, and
    wherein said plurality of MRI sequences is adjusted to cause a corresponding MRI signal to be sensitive to the one of the nuclear spin density, the relaxation time ($T_1$, $T_{1\rho}$, $T_2$, or $T_2^*$), the diffusion coefficient, the perfusion measure, the functional MRI measure, the spectral measure, and the CEST index.

8. The method of claim 4, employing the Incoherence Absorption method wherein the estimated sensitivity maps are fitted in the Support Region of the image, and wherein a sensitivity outside the Support Region is assigned based on a calculation of residual incoherent contributions.

9. The method of claim 4, employing the Artifact Suppression method wherein the coil sensitivity maps are fitted in the Support Region of the image, extrapolated outside the Support Region, then scaled by a quotient of images obtained by retroactively undersampling said substantially fully-sampled image k-space of the sample.

10. The method of claim 1, wherein the Support Region is identified via intensity thresholding.

11. The method of claim 7, further comprising reconstructing an image whose intensity is directly proportional to a spatial distribution of the one of the nuclear spin density, the relaxation time ($T_1$, $T_{1\rho}$, $T_2$, or $T_2^*$), the diffusion coefficient, the perfusion measure, the functional MRI measure, the spectral measure, and the CEST index, within the sample.

12. The method of claim 7, wherein the corresponding MRI signal is sensitive to a relaxation time and wherein said plurality of MRI sequences comprises pulse sequences in which one or more timing parameters of a pulse sequence repetition period, an inversion time, and an echo time are varied.

13. The method of claim 7, wherein the corresponding MRI signal is sensitive to a diffusion coefficient, and wherein said plurality of MRI sequences comprises sequences in which diffusion weighting pulsed magnetic field gradients are applied.

14. The method of claim 7, wherein the corresponding MRI signal is sensitive to perfusion, and wherein said plurality of MRI sequences comprises at least one sequence in which a slice selective MRI pulse is applied to inflowing blood, and at least one other sequence is applied to outflowing blood.

15. The method of claim 7, wherein the corresponding MRI signal is sensitive to a CEST index, and wherein said plurality of MRI sequences comprises at least one sequence in which a saturation pulse is applied and wherein the frequency of said saturation pulse is adjusted to be at least one of a set of offset frequencies.

16. The method of claim 7, in which the corresponding MRI signal is corrected for inhomogeneity in a main magnetic field ($B_0$).

17. A system for spatially imaging a nuclear magnetic resonance (NMR) parameter whose measurement requires the acquisition of a plurality of spatially localized NMR signals, said system comprising:
an NMR system comprising a plurality of magnetic resonance imaging (MRI) detectors, each MRI detector having a spatial sensitivity map; and
a processor in communication with said NMR system, wherein said NMR system is configured to:
apply a plurality of spatially localized MRI sequences, wherein each sequence is adjusted to be sensitive to said NMR parameter within a sample;
adjust at least one of the applied plurality of spatially localized MRI sequences so as to substantially fully sample an image k-space of the sample, and adjust the remainder of said applied plurality of spatially localized MRI sequences to under-sample the image k-space of the sample; and
acquire a plurality of image k-space NMR signal data sets, each responsive to the application of each of said plurality of spatially localized MRI sequences, wherein the processor is configured to:
estimate a sensitivity map of each of the plurality of MRI detectors using a strategy to suppress unfolding artefacts, wherein said strategy is based on data acquired from the substantially fully-sampled spatially localized MRI sequence; and
apply the estimated sensitivity maps to at least one of the image k-space NMR signal data sets to reconstruct a spatial image of NMR signals that are sensitive to said NMR parameter within a Support Region of the spatial image in which the sample resides.

18. The system of claim 17 wherein the NMR system and the processor are associated by one of an Ethernet connection, a Wi-Fi connection, or by integration of the processor into the NMR system.

19. The system of claim 17, wherein said processor is configured to reconstruct an image whose intensity is directly proportional to a spatial distribution of said NMR parameter within the sample, and
wherein the system further comprises a display system configured to display said reconstructed image.

* * * * *